(12) United States Patent
Willis et al.

(10) Patent No.: US 10,725,448 B2
(45) Date of Patent: Jul. 28, 2020

(54) SENSOR POWER CONTROL AND SIGNAL CONDITIONING CIRCUIT FOR MACHINERY MONITORING SYSTEM

(71) Applicant: Computational Systems, Inc., Knoxville, TN (US)

(72) Inventors: John W. Willis, Oak Ridge, TN (US); William E. Childress, Norris, TN (US)

(73) Assignee: Computational Systems, Inc., Knoxville, TN (US)

( * ) Notice: Subject to any disclaimer, the term of this patent is extended or adjusted under 35 U.S.C. 154(b) by 0 days.

(21) Appl. No.: 16/713,541

(22) Filed: Dec. 13, 2019

(65) Prior Publication Data

US 2020/0117170 A1 Apr. 16, 2020

Related U.S. Application Data

(60) Division of application No. 16/250,051, filed on Jan. 17, 2019, now Pat. No. 10,558,194, which is a (Continued)

(51) Int. Cl.
*G05B 19/4065* (2006.01)
*H03K 17/60* (2006.01)
(Continued)

(52) U.S. Cl.
CPC .......... *G05B 19/4065* (2013.01); *G01M 7/00* (2013.01); *H03K 5/2472* (2013.01); *H03K 17/60* (2013.01); *G05B 2219/37517* (2013.01)

(58) Field of Classification Search
CPC ... G05B 19/4065; H03K 5/2472; H03K 17/60
See application file for complete search history.

(56) References Cited

U.S. PATENT DOCUMENTS 6,115,654 A 9/2000 Eid et al.
8,700,828 B2 4/2014 Harish
(Continued)

FOREIGN PATENT DOCUMENTS

DE 102015009678 A1 1/2016

OTHER PUBLICATIONS

Dimitropoulos et al., A Low-Power CMOS VLSI Circuit for Signal Conditioning in Integrated Capacitive Sensors, 2004 IEEE, pp. 202-205 (Year: 2004).*

(Continued)

*Primary Examiner* — Toan M Le
(74) *Attorney, Agent, or Firm* — Luedeka Neely Group, P.C.

(57) ABSTRACT

A sensor signal conditioning circuit of a machinery health monitoring module is disposed between a machine sensor and an analog-to-digital converter (ADC). The circuit includes a sensor interface connector, first and second operational amplifiers, a Nyquist filter, and first and second gain flattening feedback networks. The interface connector can connect to multiple types of sensors for monitoring various machine characteristics. The output of the first operational amplifier is coupled to the positive input of the ADC, and the output of the second operational amplifier is coupled to the negative input of the ADC. The first operational amplifier provides a high impedance differential interface to the analog sensor signal and a low impedance interface to the positive input of the ADC. The second operational amplifier provides an inverted copy of a signal at the positive input of the ADC and a low impedance interface to the negative input of the ADC.

8 Claims, 11 Drawing Sheets

Related U.S. Application Data division of application No. 15/273,858, filed on Sep. 23, 2016, now Pat. No. 10,234,845, and a continuation of application No. 14/808,418, filed on Jul. 24, 2015, now Pat. No. 9,727,050, and a continuation of application No. 14/807,008, filed on Jul. 23, 2015, now Pat. No. 9,977,422, and a continuation of application No. 14/807,202, filed on Jul. 23, 2015, now Pat. No. 9,846,426.

(60) Provisional application No. 62/240,250, filed on Oct. 12, 2015, provisional application No. 62/029,606, filed on Jul. 28, 2014.

(51) Int. Cl.
*H03K 5/24* (2006.01)
*G01M 7/00* (2006.01)

(56) References Cited

U.S. PATENT DOCUMENTS

| | | | | |
|---|---|---|---|---|
| 9,727,050 | B2* | 8/2017 | Willis | G05B 19/4065 |
| 9,977,422 | B2* | 5/2018 | Steele | G05B 19/4065 |
| 10,234,845 | B2* | 3/2019 | Willis | G05B 19/4065 |
| 2016/0025599 | A1 | 1/2016 | Willis | |

OTHER PUBLICATIONS

Ranasinghe, Anuradha C., Rasnayake, Lahiru K., Kalyanapala M.; Reconfigurable Universal Sensor Interface for Distributed Wireless Sensor Nodes; 2013 International Conference on Advances in ICT for Emerging Regions (ICTer): 189-193; Department of Electronic and Computer Engineering, Sri Lanka Institute of Information Technology New Kandy Rd, Malambe, Sri Lanka; (6 pages), 2013.

* cited by examiner

SENSOR POWER CONTROL AND SIGNAL CONDITIONING CIRCUIT FOR MACHINERY MONITORING SYSTEM

RELATED APPLICATIONS

This application claims priority as a divisional of co-pending nonprovisional patent application Ser. No. 16/250,051, titled "Universal Sensor Interface for Machinery Monitoring System," which is a divisional of nonprovisional patent application Ser. No. 15/273,858, titled "Universal Sensor Interface for Machinery Monitoring System," which issued as U.S. Pat. No. 10,234,845 and is a continuation-in-part of co-pending nonprovisional patent application serial numbers:

Ser. No. 14/808,418, filed Jul. 24, 2015, titled "Processing Machinery Protection and Fault Prediction Data Natively in a Distributed Control System," which issued as U.S. Pat. No. 9,727,050;

Ser. No. 14/807,202, filed Jul. 23, 2015, titled "Parallel Digital Signal Processing of Machine Vibration Data," which issued as U.S. Pat. No. 9,846,426; and Ser. No. 14/807,008, filed Jul. 23, 2015, titled "Intelligent Configuration of a User Interface of a Machinery Health Monitoring System," which issued as U.S. Pat. No. 9,977,422, all of which claimed priority to provisional patent application Ser. No. 62/240,250, filed Oct. 12, 2015, titled "Universal Sensor Interface for Machinery Monitoring System," the entire contents of which are incorporated herein by reference.

FIELD

This invention relates to the field of machine control and machine condition monitoring. More particularly, this invention relates to a universal sensor interface for accommodating multiple sensor types for use in a machinery monitoring system.

BACKGROUND

In conventional machine protection and prediction monitoring systems, many different types of sensors are used to measure various properties of a machine, such as eddy current sensors, seismic sensors, passive magnetic sensors, piezo electric sensors, Hall-effect sensors, and low frequency sensors. Each of these sensor types has its unique characteristics related to sensor supply voltages and currents and signal output voltage ranges. To accommodate these many different types of sensors, a large number of different sensor input modules have to be developed, tested and stocked. Separate modules are typically also needed for tachometer inputs. If a single sensor interface module could handle all these various sensors and measurements, project management would be easier, production and procurement would be more cost-effective, and the number of devices in stock and the spare parts needed could be significantly reduced.

Supplying power to a plurality of sensors from a single multichannel vibration acquisition card has historically necessitated cumbersome circuit complexity due to practical application considerations, including:

Avoidance of potential adverse consequences arising from a sensor or wiring fault that results in shorted sensor power, including:

Damage to the immediate hardware;
Excessive power dissipation causing smoke or fire hazard;
Excessive demand placed upon the singular sensor power supply;
Adverse impact upon healthy adjacent sensor functionality;
Generation of incorrect control or alarm values derived from adversely affected adjacent sensor readings; and
Overall acquisition card failure;

Avoidance of potential adverse consequences arising from a concurrent plurality of sensor wiring faults, including:

Adverse impact upon cards adjacent to and upstream from the faulted card;
Excessive demand placed upon the common board-level and the upstream sensor power supplies;
Excessive temperature elevation within the system enclosure; and
Overall acquisition system failure;

Minimization of adverse data integrity effects in healthy sensor channels arising from the make/break chatter of faulty or loose adjacent sensor wiring connections;
Minimization of adverse data integrity effects in healthy sensor channels arising from the practice of "hot wiring" adjacent sensor connections;
Avoidance of adverse consequences resulting from sensor-terminal miss-wiring, e.g., connecting a +24V output to a −24V output;
Avoidance of adverse consequences resulting from connecting an external DC voltage source to a sensor supply output; and
Minimization of instantaneous energy available for the generation of hazardous sparks (pertinent to safety-critical environments, e.g. Class 1 Division 2).

The above considerations can present significant challenges to realizing cost-effective and space-constrained implementations of sensor power supply circuitry. There exists a dearth of effective integrated solutions from electronic component manufacturers, possibly due to the uncommon nature of sensor power, i.e., relatively high DC voltage at relatively low current. It is more typical to find integrated solutions for the mirror condition of low voltage and high current.

Hardware implementations of sensor interfaces in the prior art apply various combined techniques to accomplish the overall desired performance goals. These techniques tend to involve high complexity and over-specification of components and power supplies, and are often not congruent with practical space constraints. Fundamentally, a comprehensive sensor supply implementation for a multichannel sensor interface card should:

(1) provide a fast (virtually instantaneous) limiting response to a short-circuit fault;
(2) provide an accurate limiting response to a short-circuit fault;
(3) survive a continuous short-circuit fault;
(4) survive a plurality of concurrent continuous short-circuit faults in congruence with uninterrupted electrical and thermal integrity of the acquisition system;
(5) automatically recover from short circuit faults;
(6) reduce power consumption/dissipation when in a faulted condition;
(7) isolate adverse effects of a faulted channel from uninvolved channels on the same card;
(8) isolate adverse effects of loose wiring termination "chatter" from uninvolved channels on the same card;

(9) protect against adverse effects resulting from the practice of "hot wiring" sensors;
(10) protect the card and the system against reasonably anticipated installation wiring errors; and
(11) minimize the availability of spark-inducing energy to the field wiring.

Although the sensible application of discrete semiconductors can realize attribute (1) above, the electrical DC parameters of those devices exhibit significant variability, particularly when evaluated over the industrial temperature range. This variability hampers the ability to achieve attribute (2) when using the same circuitry as used to achieve attribute (1). Alternatively, one can readily implement attribute (2) through the use of a common op-amp, with the resulting solution exhibiting a response time that is too slow to achieve attribute (1). It follows that it may be reasonable to combine the op-amp and discrete solutions together in a parallel path, thereby achieving coarse, but nearly instantaneous limiting, that eventually settles into accurate long-term limiting. This approach has been implemented in prior art. However, due to variability of the initial coarse limiting stage, the method is not an optimum approach for realizing attributes (7), (8), (9) and (11) above.

What is desired is a universal sensor interface for a machine protection and prediction monitoring system that includes a sensor power control circuit that adequately achieves all of attributes (1) through (11) listed above.

SUMMARY

To overcome DC parameter variability in the discrete bipolar transistor and take full advantage of its fast response to transients, the highly variable parameter of base-emitter turn-on voltage ($V_{BEon}$) must be removed from the equation. Embodiments of the invention described herein adequately fulfill this requirement by use of a small capacitor to hold the instantaneous DC operating value of $V_{BEon}$, whatever that voltage may be. Because the voltage on a capacitor cannot change instantaneously, this held value can act as a current-controlling reference for the transistor over a very short period of time, e.g., immediately following an output short-circuit event. Preferred embodiments also provide an adequately fast secondary controlling mechanism for the indefinitely longer time period immediately following the initial fault event.

While the use of a capacitor can overcome the issue of $V_{BEon}$ variability during the initial stage of a fault, the response time of a typical op-amp impedes its ability to provide the follow-up controlling mechanism. A comparator would appear to be more commensurate with that function, since even some ultralow-power devices (with consumption measured in the tens of microamperes) have acceptable response times. However, comparators are not intended for use as continuous signal amplifiers, and many contain internal positive feedback that prevents their application in this manner. Comparators can, however, be useful building blocks for switching topologies. The result of this line of thought are embodiments of a switching topology that provide optimal solutions to the problem at hand. After significant time spent in conceptualization and simulation, the inventors have derived a simple and practical implementation that has been realized and verified in hardware.

Although one might suggest that providing protection against sensor or wiring fault scenarios is not a core function of sensor interface hardware, this viewpoint would justifiably be rejected by equipment end users. Sensor wiring issues are not uncommon occurrences, and if the effects from a single-channel fault are not contained to the faulted channel, a likely consequence will be a disgruntled equipment user. Absent the inclusion of the solutions described herein, a multi-channel sensor interface card design may need to incorporate a separate sensor power supply for each channel, incurring extra cost and complexity, and having the channel density per card, cabinet or rack dictated by spacing constraints. Preferred embodiments described herein consume minimal printed circuit board area.

Also described herein is sensor signal conditioning circuitry that conditions sensor signals prior to digitization. A preferred embodiment of the signal conditioning circuitry uses precision components (0.1% thin film resistors) to avoid the need for calibration of gain and offset and to minimize front-end resistor current noise (also known as "extra" noise). Precision components (1% capacitors) also are used to maintain good common-mode rejection throughout the pass-band.

Further, implementation of 64× oversampling in a delta-sigma ADC pushes the frequency dependency outside of the measurement range. Such oversampling greatly loosens requirements of the antialiasing filter that is part of the signal conditioning circuitry, thereby reducing the filter's effect upon pass-band signals, and likewise reducing sensitivity to filter component tolerances.

Preferred embodiments of the signal conditioning circuitry use only passive filter circuits, which can be much less complex than active circuitry due at least in part to the absence of active components. The placement of passive Nyquist filtering upstream of active signal conditioning circuitry helps to shield the active circuitry against RF energy that might potentially be introduced by sensor field wiring.

Embodiments of the invention described herein provide a sensor power and signal conditioning circuit of a machinery health monitoring module. The sensor power and signal conditioning circuit includes a sensor interface connector, signal conditioning circuitry, sensor power supply circuitry, configuration circuitry, and analog-to-digital conversion circuitry.

The sensor interface connector receives an analog sensor signal generated by a connected sensor. In preferred embodiments, the sensor interface connector is operable to connect to multiple types of sensors that may be attached to a machine to monitor various characteristics of the machine.

The signal conditioning circuitry includes a plurality of sensor signal conditioning circuits, each for accommodating a sensor signal input range that is different from one or more sensor signal input ranges accommodated by other of the sensor signal conditioning circuits. The signal conditioning circuitry also includes a first software controllable switch that, based on an input range selection signal, selects one of the plurality of sensor signal conditioning circuits to receive the analog sensor signal generated by the connected sensor.

The sensor power supply circuitry, which supplies power to the connected sensor, includes a plurality of individually selectable sensor power circuits, each for providing power over a voltage range that is different from one or more voltage ranges provided by other of the sensor power circuits. The sensor power supply circuitry also includes a second software controllable switch that, based on a power range selection signal, selects one of the plurality of sensor power circuits to provide power to the connected sensor. The configuration circuit generates the input range selection signal and the power range selection signal based at least in part on a user selection of the type of connected sensor.

In some embodiments, the sensor interface connector is operable to connect to multiple types of sensors, including piezo accelerometers, Integrated Circuit Piezoelectric (ICP) vibration sensors, piezo dynamic pressure sensors, electrodynamic velocity sensors, eddy current displacement sensors, AC vibration sensors, DC displacement sensors, passive electro-magnetic sensors, Hall Effect tachometer sensors, shaft encoder sensors, and TTL pulse sensors.

In some embodiments, the sensor signal conditioning circuits support input signals over a +12 volt to −12 volt range, a +24 volt to −24 volt range, a 0 volt to +24 volt range, and a 0 volt to −24 volt range. In some embodiments, the individually selectable sensor power circuits include a zero milliamp to 20 milliamp constant current source.

In another aspect, embodiments of the invention provide a sensor power controlling circuit of a machinery health monitoring module. The sensor power controlling circuit includes (1) a positive voltage input for receiving a positive voltage from a galvanically isolated voltage source within the machinery health monitoring module, (2) a sensor power connecter for providing power to a sensor, (3) a push-pull comparator having a positive input, a negative input, and an output, (4) a first resistor, (5) a PNP transistor, and (6) a first capacitor.

The PNP transistor has a base, an emitter and a collector. The base is electrically coupled to a second side of the first resistor. The emitter is electrically coupled to the negative input of the push-pull comparator through a first resistor divider network, to the positive voltage input of the sensor power circuit through a second resistor, and to the positive input of the push-pull comparator through a second resistor divider network. The collector is electrically coupled to the sensor power connecter.

The first resistor has a first side that is electrically coupled to the output of the push-pull comparator. The first capacitor has a first side that is electrically coupled to the second side of the first resistor and to the base of the PNP transistor. The first capacitor has a second side that is electrically coupled to the positive voltage input of the sensor power circuit and to the positive input of the push-pull comparator via the second resistor divider network.

When a base current at the base of the PNP transistor is at a level sufficient to cause the PNP transistor to be in a saturated ON state, the PNP transistor electrically couples the positive voltage input of the sensor power circuit to the sensor power connecter.

During normal operation, current flowing through the second resistor into the emitter of the PNP transistor is below a nominal threshold current level, which causes a first bias voltage on the positive input of the push-pull comparator to be less than a second bias voltage on the negative input of the push-pull comparator, thereby causing a low-state voltage to appear at the output of the push-pull comparator.

A first RC time constant exists as determined by the capacitance of the first capacitor and a total effective resistance at the base node of the PNP transistor. When the transistor collector current increases abruptly relative to the first RC time constant, such as would occur immediately following a short circuit across the sensor power connector, voltage across the second resistor increases faster than voltage across the first capacitor increases, resulting in an instantaneous net reduction of emitter-base voltage of the PNP transistor. The net reduction of the emitter-base voltage of the PNP transistor impedes the PNP transistor from delivering increased load current for a time period that is greater than the propagation delay from the inputs to the output of the push-pull comparator.

When load current demand exceeds the nominal threshold current level, such as would occur when a short circuit exists across the sensor power connector, three events occur:

(1) The current flowing through the second resistor into the emitter of the PNP transistor rises to above the nominal threshold current level, which causes the first bias voltage on the positive input of the push-pull comparator to be greater than the second bias voltage on the negative input of the push-pull comparator, thereby causing a high-state voltage to appear at the output of the push-pull comparator.

(2) The high-state voltage at the output of the push-pull comparator sources current into the first capacitor, which reduces the base current available to the PNP transistor.

(3) The reduced base current of the PNP transistor causes reduction of current into the emitter of the PNP transistor, which causes the current flowing through the second resistor to decrease to below the nominal threshold current level. This causes the first bias voltage on the positive input of the push-pull comparator to be less than the second bias voltage on the negative input of the push-pull comparator, which in turn causes the low-state voltage to reappear at the output of the push-pull comparator.

Events (1), (2) and (3) repeat at a first rate while the load current demand exceeds the nominal threshold current level. In some embodiments, the first rate is about 1.0 MHz.

In some embodiments, the sensor power circuit includes a non-linear foldback circuit comprising a Zener diode and a third resistor. The Zener diode has a cathode that is electrically coupled to the negative input of the push-pull comparator. The third resistor is electrically coupled between the anode of the Zener diode and the collector of the PNP transistor. When a voltage on the collector of the PNP transistor falls below a threshold voltage, the Zener diode begins to conduct, thereby drawing current through the third resistor from the negative input node of the push-pull comparator. The current drawn from the negative input node of the push-pull comparator modifies the second bias voltage of the push-pull comparator. This results in a reduced current level flowing through the PNP transistor and thus reduced power dissipation in the PNP transistor when the sensor power connector is shorted or is pulled negative by an external voltage source.

In some embodiments, the output voltage ($V_{OUT}$) and the output current ($I_{OUT}$) at the sensor power connector are characterized by the following nominal foldback limiting function:

$V_{OUT} \geq 6V$, $I_{OUT} = 39.2$ mA Max
$V_{OUT} = 5V$, $I_{OUT} = 35.9$ mA Max
$V_{OUT} = 4V$, $I_{OUT} = 31.7$ mA Max
$V_{OUT} = 3V$, $I_{OUT} = 27.3$ mA Max
$V_{OUT} = 2V$, $I_{OUT} = 23.0$ mA Max
$V_{OUT} = 1V$, $I_{OUT} = 18.6$ mA Max
$V_{OUT} = 0V$, $I_{OUT} = 14.2$ mA Max.

In some embodiments, the sensor power circuit includes a fourth resistor, a second capacitor, a third capacitor and a fourth capacitor. The fourth resistor is coupled between the base and the emitter of the PNP transistor and assists with cutoff of the PNP transistor. The second capacitor is electrically coupled between the second side of the first capacitor and the positive input of the push-pull comparator. The third capacitor is electrically coupled between the emitter of the PNP transistor and the negative input of the push-pull comparator. The fourth capacitor is electrically coupled between the positive input of the push-pull comparator and the output of the push-pull comparator. The second, third and fourth capacitors promote deterministic astable behavior of the sensor power circuit.

In some embodiments, the sensor power circuit includes a fifth capacitor that is electrically coupled between the collector of the PNP transistor and electrical ground. The fifth capacitor promotes closed-loop stability when current limiting is in effect.

In yet another aspect, preferred embodiments of the invention provide a sensor signal conditioning circuit of a machinery health monitoring module. The sensor signal conditioning circuit, which is disposed between a machine sensor and an analog-to-digital converter (ADC), includes a sensor interface connector, a first and second operational amplifier, a passive Nyquist filter, and first and second gain flattening feedback networks.

The sensor interface connector is operable to connect to multiple types of sensors that may be attached to a machine to monitor various characteristics of the machine. The sensor interface connector includes a negative sensor signal input and a positive sensor signal input for receiving a differential analog sensor signal generated by a connected sensor.

The first operational amplifier, which provides a high impedance differential interface to the analog sensor signal and a low impedance interface to the positive ADC input, has a negative signal input, a positive signal input, and a signal output. The second operational amplifier provides an inverted copy of the signal output from the first operational amplifier and a low impedance interface to the negative ADC input, the operational amplifier having a negative signal input, a positive signal input, and a signal output.

The passive Nyquist filter is connected between the negative sensor signal input of the sensor interface connector and the negative signal input of the first operational amplifier. The passive Nyquist filter is also connected between the positive sensor signal input of the sensor interface connector and the positive signal input of the first operational amplifier.

The first gain flattening feedback network is connected between the negative signal input of the first operational amplifier and the output of the second operational amplifier. The second gain flattening feedback network is connected between the positive signal input of the first operational amplifier and the output of the first operational amplifier.

Connections to the ADC include a positive ADC input connection and a negative ADC input connection. Both of these connections are electrically coupled to the signal outputs of the operational amplifiers.

In some embodiments, the passive Nyquist filter includes resistors R15, R16, R18 and R19, and capacitors C8, C9 and C10. A first side of the resistor R15 is electrically coupled to the negative sensor signal input of the sensor interface connector. A first side of the resistor R16 is electrically coupled to the second side of the resistor R15. A second side of the resistor R16 is electrically coupled to the negative signal input of the first operational amplifier. A first side of the resistor R18 is electrically coupled to the positive sensor signal input of the sensor interface connector. A first side of the resistor R19 is electrically coupled to the second side of the resistor R18. A second side of the resistor R19 is electrically coupled to the positive signal input of the first operational amplifier. The capacitor C8 has a first side that is electrically coupled to the second side of the resistor R15, and a second side that is electrically coupled to electrical ground. The capacitor C9 has a first side that is electrically coupled to the second side of the resistor R15, and a second side that is electrically coupled to the second side of the resistor R18. The capacitor C10 has a first side that is electrically coupled to the second side of the resistor R18, and a second side that is electrically coupled to electrical ground. The resistors R15, R16, R18 and R19 are preferably thin film resistors having a resistance value tolerance of no more than 0.1%. The capacitance values of the capacitors C8, C9 and C10 preferably have a tolerance of no more than 1%.

In some embodiments, the sensor signal conditioning circuit includes a resistor R17 having a first side that is electrically coupled to the negative signal input of the first operational amplifier, and a second side that is electrically coupled to the positive ADC input connection. The gain of the sensor signal conditioning circuit of these embodiments is determined by twice the ratio of the resistance value of the resistor R17 to a sum of the resistance values of the resistors R15 and R16. The resistor R17 is preferably a thin film resistor having a resistance value tolerance of no more than 0.1%.

In some embodiments, the sensor signal conditioning circuit includes an adjustable DC offset input. These embodiments also include a resistor R20 having a first side that is electrically coupled to the positive signal input of the first operational amplifier, and a second side that is electrically coupled to the adjustable DC offset input. The input differential voltage offset of the sensor signal conditioning circuit is preferably determined by the product of a multiplicand: the ratio of the sum of the resistance values of the resistors R18 and R19 to the resistance value of the resistor R20, and a multiplier: the difference between the fixed +2.5V DC offset voltage and the adjustable DC offset voltage. The resistor R20 is preferably a thin film resistor having a resistance value tolerance of no more than 0.1%.

In some embodiments, the first gain flattening feedback network includes a capacitor C13 and a resistor R25. A first side of the capacitor C13 is electrically coupled to the negative signal input of the first operational amplifier. The resistor R25 has a first side that is electrically coupled to the second side of the capacitor C13, and a second side that is electrically coupled to the signal output of the second operational amplifier.

In some embodiments, the second gain flattening feedback network includes a capacitor C14 and a resistor R26. A first side of the capacitor C14 is electrically coupled to the positive signal input of the first operational amplifier. The resistor R26 has a first side that is electrically coupled to the second side of the capacitor C14, and a second side that is electrically coupled to the signal output of the first operational amplifier. The resistors R25 and R26 preferably have a tolerance of no more than 1%. The capacitance values of the capacitors C13 and C14 preferably have a tolerance of no more than 1%.

In some embodiments, the operational amplifier is powered by a single rail +5 VDC power connection, with no need for a negative power connection.

In some embodiments, the variation in signal gain from the sensor interface connector through to the input of the ADC over a frequency range of zero to 40 KHz is no more than about 0.8%, even with no calibration.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Preferred embodiments of a universal sensor interface may be implemented in a vibration data acquisition and analysis module that interfaces directly to a distributed control system I/O backplane to allow direct acquisition of vibration data by the DCS for purposes of machinery protection and predictive machinery health analysis. As the term is used herein, a "distributed control system (DCS)" is a type of automated control system used in a process or plant in which control elements are distributed throughout a machine or multiple machines to provide operational instructions to different parts of the machine(s). As the term is used herein, "protection" refers to using data collected from one or more sensors (vibration, temperature, pressure, etc.) to shut down a machine in situations in which severe and costly damage may occur if the machine is allowed to continue running. "Prediction" on the other hand refers to using data collected from one or more vibration sensors, perhaps in combination with data from other types of sensors, to observe trends in machine performance and predict how much longer a machine can operate before it should be taken offline for maintenance or replacement.

Figure 1:
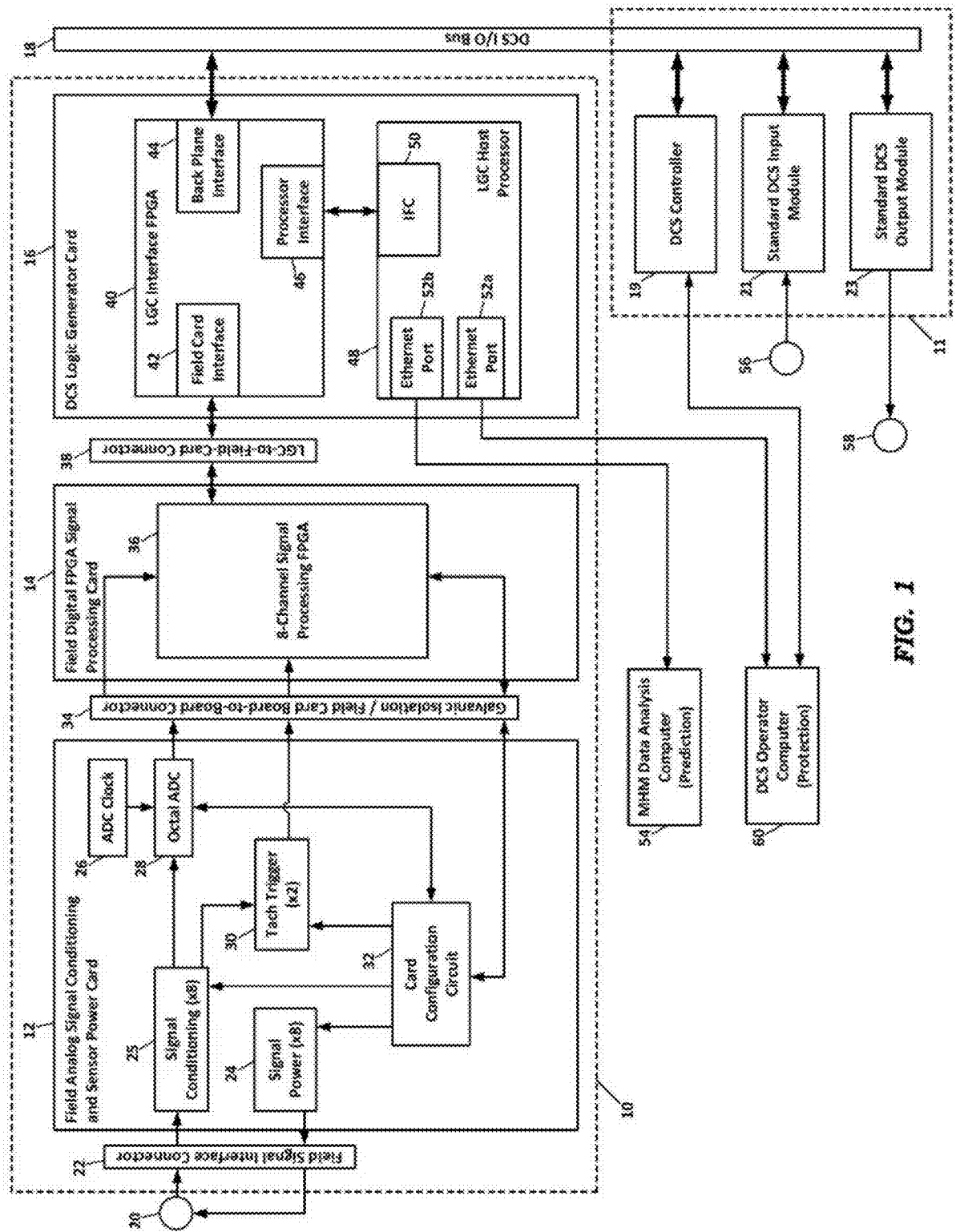
FIG. 1 depicts a machinery health monitoring (MHM) module according to an embodiment of the invention.

FIG. 1 depicts a machinery health monitoring module (MHM) 10 that directly interfaces with a DCS 11. In the preferred embodiment, the module 10 includes a field analog signal conditioning and sensor power card 12 that receives and conditions sensor signals, a field digital FPGA signal processing card 14 that processes the sensor signals, and a DCS logic generator card (LGC) 16 that provides an interface to a DCS I/O bus 18. The field card 12 can preferably accept input from up to eight measurement sensors 20 through a field signal interface connector 22. In a preferred embodiment, two of the sensor input channels may be configured as tachometer channels.

Preferably, galvanic electrical isolation is provided between the analog field card 12 and the digital field card 14. This electrical isolation prevents unintentional current flow, such as due to ground loops, between the mounting locations of the sensors 20 and the DCS 11.

As described in more detail hereinafter, sensor power circuit 24 and signal conditioning circuit 26 can support a wide range of sensors 20, including piezo accelerometers, piezo ICP velocity, piezo dynamic pressure, electro-dynamic velocity, eddy current displacement, AC vibration, and DC displacement. Tachometer sensors that are supported include eddy current displacement sensors, passive electro-magnetic sensors, Hall Effect tachometer sensors, N pulse/rev shaft encoders, and TTL pulse sensors. Many additional sensor types are supported over the frequency range of DC to 20 KHz as long as they fall within the following exemplary voltage input ranges: 0 to +24V, −24V to +24V, −12V to +12V, and 0 to −24V. In the preferred embodiment, up to eight sensor power circuits 24 can be individually programmed for a constant current of between 0 and 20 mA, which may also be used as lift current for an electro-dynamic (passive) velocity sensor. Constant voltage sources (+24 VDC or −24 VDC) may be selected as well as constant current. The input voltage ranges listed above are also individually programmable on each sensor channel. This permits any mix of sensor power and input range configuration between the channels, thereby enabling a mix of supported sensors.

With timing provided by a clock 26, an 8-channel analog-to-digital converter (ADC) 28 converts the eight analog signals into a single serial data stream comprising eight simultaneously sampled interleaved channels of data. In some preferred embodiments, two tachometer triggering circuits 30 convert the two analog tachometer signals into tachometer pulses.

On the field card 14 is an 8-channel field programmable gate array (FPGA) 36 for processing the vibration data. The FPGA 36 receives the 8-channel digital waveform data and 2-channel tachometer data and processes the raw data in parallel to generate scalar overall vibration parameters and waveforms. The processed waveforms may include low-pass filtered, PeakVue™, order tracking, high-pass filtered (DC blocked), and selectable single-integrated (velocity), double-integrated (displacement), or non-integrated (acceleration) waveforms. Prediction data channels also preferably include an up-sampling data block to provide higher resolution data for Time Synchronous Averaging (TSA) or order tracking applications.

The vibration card configuration circuit 32 of the analog field card 12 preferably includes of a set of serial-to-parallel latch registers that accept a serial data stream of configuration data from the application firmware of the LGC 16. This data is loaded into a parallel-to-serial shift register in the interface of the FPGA 36. The FPGA 36 then handles shifting the serial data to the control latches using a synchronous SPI format.

During operation of the preferred embodiment, the MHM module 10 appears to the DCS controller 19 as a multichannel analog input card having scalar outputs similar to those of a standard DCS input module 21, such as may be outputting measured temperature, pressure, or valve position values. As discussed in more detail hereinafter, vibration signals are converted to scalar values by the module 10 and presented to the DCS controller 19 via the backplane of the DCS. One example of a DCS controller 19 is the Ovation™ controller manufactured by Emerson Process Management (a division of Emerson Electric Co.). In the typical DCS architecture, only sixteen scalar values are presented as high speed scan values to the DCS controller 19. In a high speed scan, the DCS controller 19 can read these sixteen scalar values at up to a 10 mS rate.

Time waveform block data (and some scalar values) may be transferred to the DCS controller 19 via the DCS I/O bus 18 using a block data transfer method, such as Remote Desktop Protocol (RDP), at a rate that is lower than the scan rate of the sixteen scalar values.

As the scalar values generated by the machinery health monitoring module 10 are read by the DCS controller 19, they are processed by software running in the DCS controller 19 in the same manner as any other DCS data. One primary function of the DCS controller 19 is to compare the scalar values with alarm limits. If the limits are exceeded, alarms are generated. Logic within the DCS controller 19 may also determine whether any actions should be taken based on alarm conditions, such as closing a relay. Operations including alarm relay logic, voting, and time delays are also performed in software by the DCS controller 19. Preferably, DCS control outputs, such as relay outputs and 4-20 mA proportional outputs, are driven by standard output modules 23 of the DCS. Bulk prediction data is formatted in the LGC host processor 48 and is transmitted via an Ethernet port 52a to a machine health management (MHM) analysis computer 54 for detailed analysis and display. Bulk protection data is also formatted in the LGC host processor 48, but is transmitted via a separate Ethernet port 52b to the DCS operator computer 60.

In preferred embodiments, a DCS operator computer 60 includes an interface for displaying vibration parameters and other machine operational data (pressures, temperatures, speeds, alarm conditions, etc.) that are output from the DCS controller 19.

Figure 2:
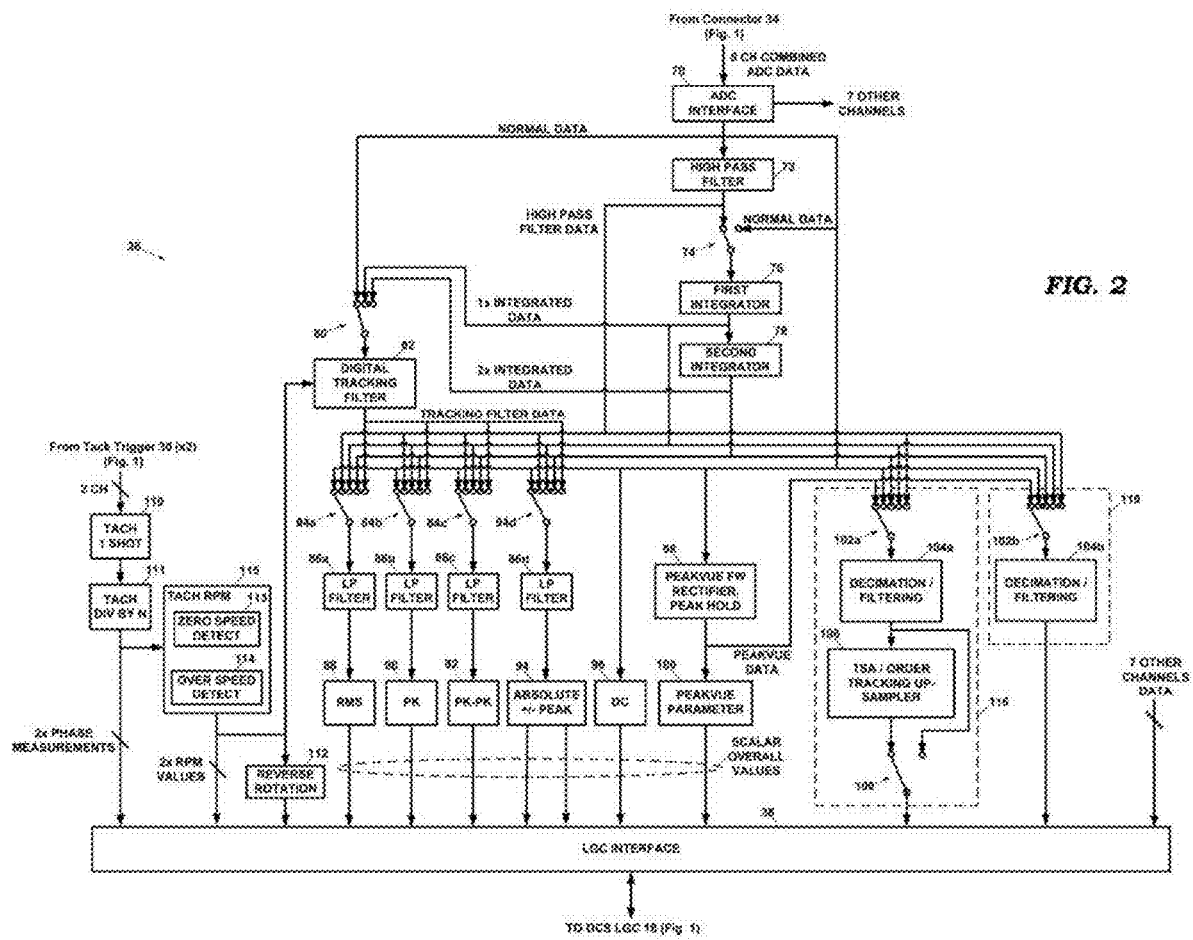
FIG. 2 depicts field digital FPGA signal processing circuitry according to an embodiment of the invention.

A functional block diagram of a single channel of the field digital FPGA 36 is depicted in FIG. 2. A preferred embodiment includes seven additional channels having the same layout as the one channel depicted in FIG. 2. As described in more detail hereinafter, the channel digital waveform data may be routed through a variety of digital filters and integration stages before being converted to vibration overall values or packaged as "bulk" time waveforms for further analysis by software running on the LGC card 16 or for transmission to DCS software or MEM software.

As shown in FIG. 2, an ADC interface 70 receives the eight channels of continuous, simultaneously sampled data from the ADC 28 of the field analog card 12 through the connector 34 (shown in FIG. 1). The data is preferably in the form of a multiplexed synchronous serial data stream in Serial Peripheral Interface (SPI) format. The ADC interface 70 de-multiplexes the data stream into eight separate channel data streams.

Although all eight channels could be used for vibration signal processing, in a preferred embodiment two of the eight channels may be used for tachometer measurement processing. Each tachometer measurement channel preferably includes:

a one-shot 110, which is a programmable trigger "blanking" function that provides noise rejection for tachometer pulse trains having excessive jitter or noise;

a divide-by-N 111, which is a programmable pulse divider that divides pulse rates of tachometer signals produced by gears or code wheels;

a reverse rotation detector 112 that determines the direction of shaft rotation by comparing the phase of two tachometer pulse signals;

an RPM indicator 115 that calculates the RPM of the tachometer pulse stream as a scalar overall value.

a zero-speed detector 113 that provides a "zero speed" indication when the tachometer has been inactive for a programmable interval, such as 0.1 s, 1 s, 10 s, or 100 s; and an over-speed detector 114 that provides an "over speed" indication when the tachometer exceeds a fixed 2 KHz or 62 KHz threshold. In alternative embodiments, this threshold may be programmable.

With continued reference to FIG. 2, each of the eight independent parallel channels of signal processing in the FPGA 36 preferably includes the following components:

a high pass filter 72 for DC blocking, which is preferably be set to 0.01 Hz, 0.1 Hz, 1 Hz, or 10 Hz, and which may be selected or bypassed for the integrators described below based on the position of a switch 74;

two stages of digital waveform integration, including a first integrator 76 and a second integrator 78, which provide for data unit conversion from acceleration to velocity, acceleration to displacement, or velocity to displacement;

a digital tracking band pass filter 82 having a band pass center frequency that is set by the tachometer frequency or multiples of the tachometer frequency, and that receives as input either the "normal" data stream (no integration), the single integration data stream, or the double integration data stream based on the position of a switch 80, as described in more detail below; and scalar overall measurement calculation blocks 88-100 that determine several different waveform scalar overall values as described below.

In the preferred embodiment, the purpose of the digital tracking band pass filter 82 is to provide a narrow (high Q) band pass response with a center frequency determined by the RPM of a selected tachometer input. The center frequency may also be a selected integer multiple of the tachometer RPM. When a waveform passes through this filter, only vibration components corresponding to multiples of the turning speed of the monitored machine will remain. When the RMS, peak, or peak-to-peak scalar value of the resultant waveform is calculated by the corresponding FPGA calculation block (88, 90 or 92), the result is same as a value that would be returned by an "nX peak" calculation performed in the application firmware of the LGC 16. Because this scalar calculation is performed as a continuous process in the FPGA 36 rather than as a calculation done in firmware, it is better suited to be a "shutdown parameter" as compared to a corresponding value produced at a lower rate in firmware. One application of this measurement is in monitoring aero-derivative turbines, which generally require a tracking filter function for monitoring.

For several of the scalar overall values, the individual data type from which the values are calculated may be selected from the normal data stream, the single-integrated data stream, the double-integrated data stream, the high-pass filtered (DC blocked) data stream, or the tracking filter data stream based on the positions of the switches 84a-84d. Also, several of the scalar overall channels have an individually-programmable low-pass filter 88a-88d. In the preferred embodiment, these scalar overall values are generated independently of and in parallel to the time waveforms that are used for prediction or protection. The scalar overall measurement calculation blocks preferably include:

- an RMS block 88 that determine the RMS value of the time waveform, where the RMS integration time may preferably be set to 0.01 s, 0.1 s, 1 s, or 10 s;
- a peak block 90 that determines the greater of the positive or negative waveform peak value relative to the average value of the waveform, which is preferably measured over a period determined by either the tachometer period or a programmable time delay;
- a peak-peak block 92 that determines the waveform peak-to-peak value over a period determined by either the tachometer period or a programmable time delay;
- an absolute+/− peak block 94 that determines the value of the most positive signal waveform excursion and the value of the most negative signal waveform excursion relative to the zero point of the measurement range, which is preferably measured over a period determined by either the tachometer period or a programmable time delay;
- a DC block 96 that determines the DC value of the time waveform, which has a measurement range preferably set to 0.01 Hz, 0.1 Hz, 1 Hz, or 10 Hz; and
- a PeakVue™ block 100 that determines a scalar value representing the peak value of the filtered and full-wave-rectified PeakVue™ waveform as described in U.S. Pat. No. 5,895,857 to Robinson et al. (incorporated herein by reference), which is preferably measured over a period determined by either the tachometer period or a programmable time delay. Full wave rectification and peak hold functions are implemented in the functional block 98. The PeakVue™ waveform from the block 98 is also made available as a selectable input to the prediction time waveform and protection time waveform processing described herein.

The prediction time waveform processing section 116 of the FPGA 36 provides a continuous, filtered time waveform for use by any prediction monitoring functions. An independent lowpass filter/decimator 104a is provided so that the prediction time waveform may be a different bandwidth than the protection time waveform. A waveform up-sampling block 106 provides data rate multiplication for analysis types such as Time Synchronous Averaging (TSA) and Order Tracking. Input to the prediction time waveform processing section 116 may be selected from the normal data stream, the single-integrated data stream, the double-integrated data stream, the high-pass filtered (DC blocked) data stream, or the PeakVue™ data stream based on the positions of the switch 102a.

The protection time waveform section 118 of the FPGA 36 provides a continuous, filtered time waveform for use by protection monitoring functions. An independent low pass filter/decimator 104b is provided so that the protection time waveform may be a different bandwidth than the prediction time waveform. Input to the protection time waveform processing section 118 may be selected from the normal data stream, the single-integrated data stream, the double-integrated data stream, the high-pass filtered (DC blocked) data stream, or the PeakVue™ data stream based on the positions of the switch 102b.

Preferred embodiments provide for transient data collection, wherein continuous, parallel time waveforms from each signal processing channel may be collected for transmission to external data storage. Transient waveforms are preferably fixed in bandwidth and are collected from the protection time waveform data stream.

As shown in FIG. 1, the scalar overall values, as well as the digitally filtered time waveforms, pass through the LGC interface 38 to the LGC logic board 16 for further processing and transportation to the DCS controller 19 via the DCS I/O backplane 18 or to external software applications running on the MHM data analysis computer 54 via the Ethernet port 52.

Figure 3:
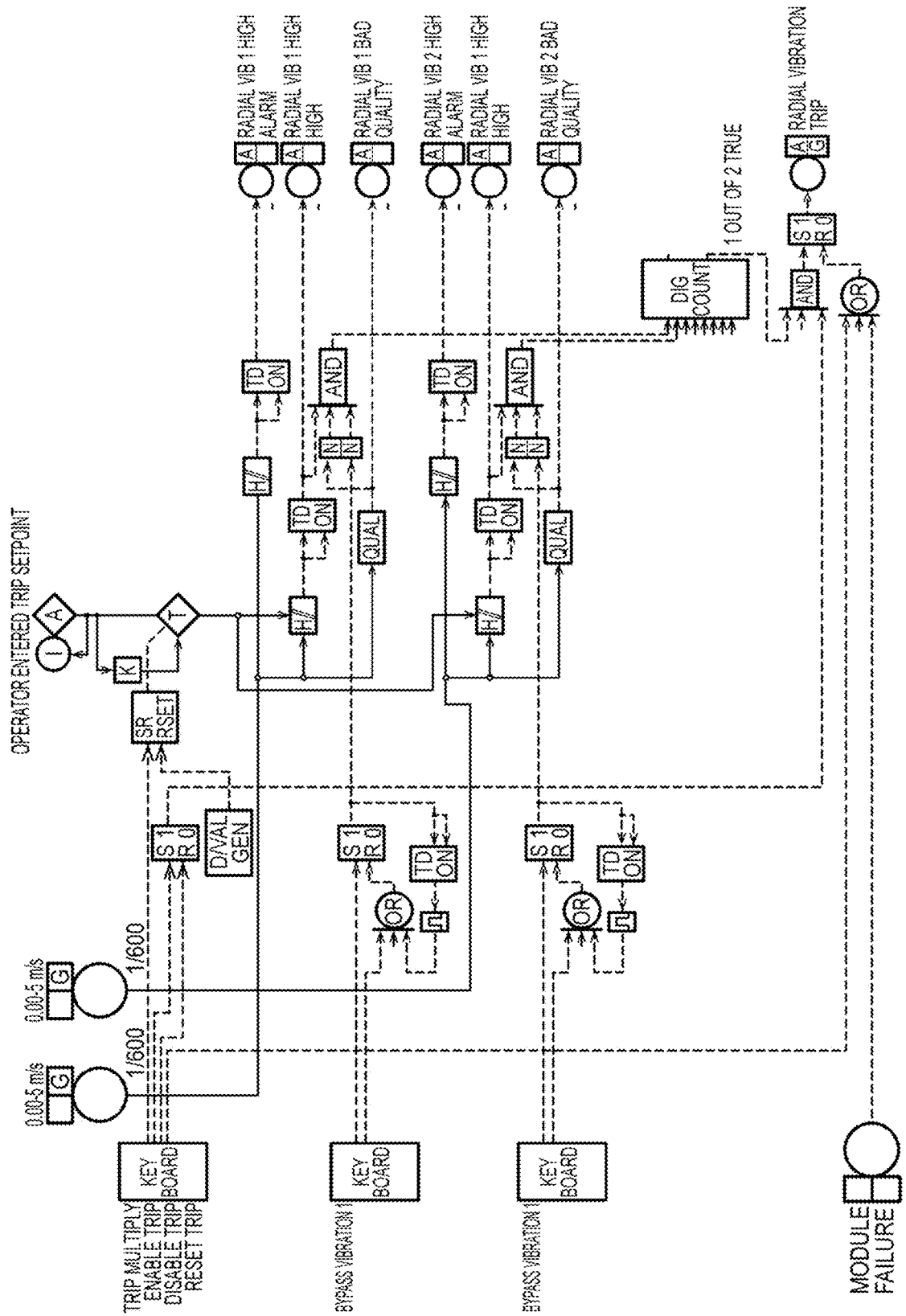
FIG. 3 depicts an example of control logic executed by a DCS controller according to an embodiment of the invention.

FIG. 3 depicts an example of a control logic routine (also referred to herein as a control sheet) that is performed by the DCS controller 19. In preferred embodiments, a control sheet is scheduled to execute at a predetermined rate, such as 1 sec, 0.1 sec, or 0.01 sec, by the DCS software running in the controller 19. As the control sheet that controls the vibration process is executed, scalar overall vibration values are scanned from the DCS I/O bus 18 and output values are generated at the execution rate of the control sheet.

Logic functions performed by the control sheets preferably include:

- Voting logic, such as logic to determine that an alert condition exists if 2 out of 2 scalar values are over threshold, or 2 out of 3 are over threshold.
- Combining vibration data with other DCS process parameter data (such as pressure and temperature).
- Trip multiply, which is a temporary condition determined by current machine state or by manual input that increases an alarm level. Trip multiply is typically used during the startup of a rotational machine, such as a turbine. As the turbine speeds up, it normally passes through at least one mechanical resonance frequency. Since higher than normal vibration conditions are measured during this resonance, "trip multiply" is used to temporarily raise some or all of the alarm levels to avoid a false alarm trip. The trip multiply input may be set manually with operator input, or automatically based on RPM or some other "machine state" input.
- Trip bypass, which is typically a manual input to suppress operation of the output logic to disable trip functions, such as during machine startup. Trip bypass is a function that suppresses either all generated vibration alarms, or any outputs that would be used as a trip control, or both. The trip bypass input may be set manually with operator input, or automatically based on some "machine state" input.
- Time delay, which is a delay that is normally programmed to ensure that trip conditions have persisted for a specified time before allowing a machine trip to occur. Trip time delays are normally set to between 1 and 3 seconds as recommended by API670. The purpose of this delay is to reject false alarms caused by mechanical or electrical spikes or glitches.

Universal Sensor Interface

Figure 4:
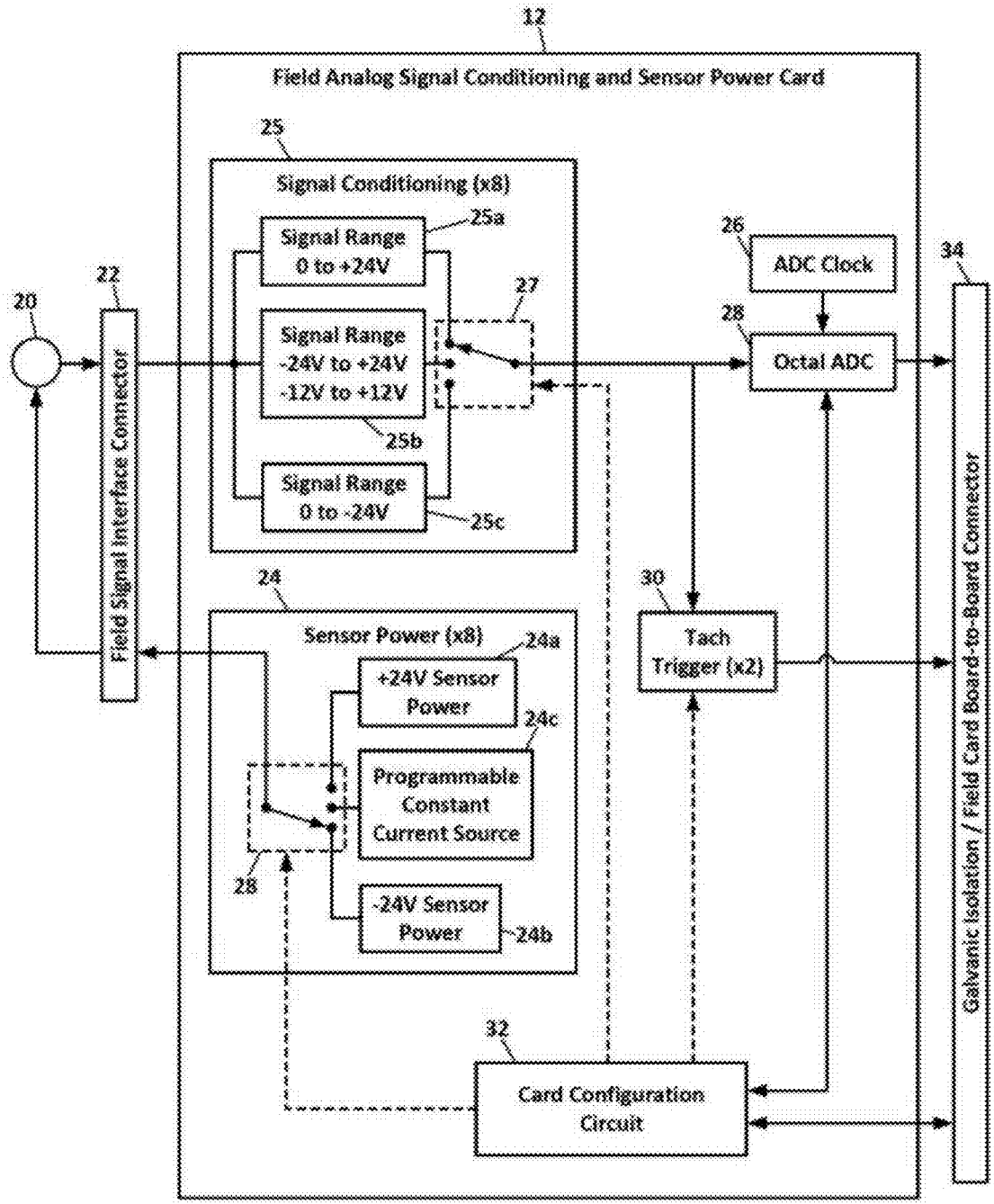
FIG. 4 depicts a preferred embodiment of a universal signal conditioning and sensor power card according to an embodiment of the invention.

FIG. 4 depicts a preferred embodiment of a single channel of the field analog signal conditioning and sensor power card 12. In this embodiment, the sensor power circuit 24 includes a software controllable switch 28 that is operable to switch between a +24V power supply 24a, a −24V power supply 24b, or a programmable constant current source 24c. The signal for activating the switch 28 is preferably provided by the card configuration circuit 32. As shown in FIG. 4, the signal conditioning circuit 25 includes a software controllable switch 27 that is operable to switch between multiple sensor signal conditioning circuits having multiple input signal ranges, including a 0 to +24V circuit 25a, a −24V to +24V and −12V to +12V circuit 25b, and a 0 to −24V circuit 25c. The signal for activating the switch 27 is preferably provided by the card configuration circuit 32.

In a preferred embodiment, software running on the MHM data analysis computer 54 (FIG. 1) receives input from a user to indicate the type of sensor 20 connected to each measurement channel. This input may be made by selection of the sensor type from a list of sensors in a dropdown menu displayed on a screen of the computer 54. Based on the sensor type selection, the LGC 16 generates the data stream to set the latches of the card configuration circuit 32 to effect the appropriate settings of the switches 27 and 28.

As discussed above, to minimize the complexity of the diagram, only one sensor channel is shown in FIG. 4. In a preferred embodiment, there are eight sensor input channels that each include a software controllable sensor power circuit 24 and signal conditioning circuit 25 that are operated independently of the circuits 24 and 25 in the other channels. Thus, the channel input configurations are independent from channel to channel so that a variety of different sensor types may be supported simultaneously.

As the phrase is used herein, when two electrical components in a circuit are "electrically coupled," it means that a terminal or pin of one component is in electrical communication with a terminal or pin of the other component, either directly or through one or more intervening components. Thus, for example, when a pin or terminal of a first component is electrically connected directly to a pin or terminal of a second component, the first and second components are "electrically coupled." As another example, when a pin or terminal of the first component is electrically connected to a pin or terminal of an intervening component, and a pin or terminal of the intervening component is electrically connected to a pin or terminal of the second component, the first and second components are "electrically coupled."

Figure 5:
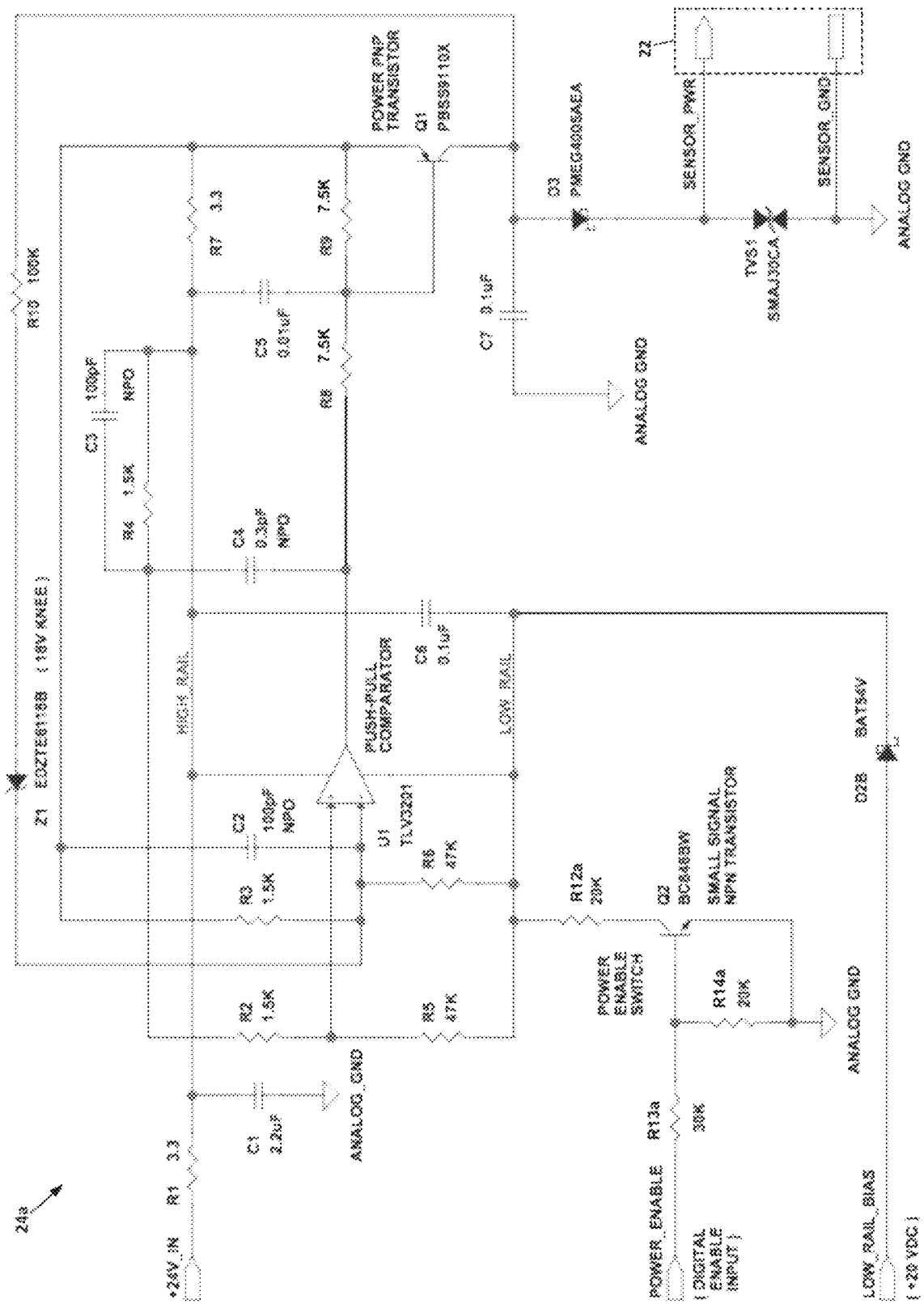
FIGS. 5 and 6 depict a preferred embodiment of a sensor power control circuit having instantaneous current limiting and incorporating nonlinear foldback according to an embodiment of the invention.

A detailed circuit diagram of a preferred embodiment of the +24V sensor power control circuit 24a for one sensor channel is provided in FIG. 5. Positive 24 VDC nominal power comes in from the left side (+24V_IN) and is low-pass filtered by resistor R1 and capacitor C1. This filter attenuates residual switching noise from the input source and provides 3.3Ω of series resistance to impede sensor-induced transient currents traveling back into the circuit. Also coming in on the left side is the POWER_ENABLE digital control signal. A nominal threshold voltage of greater than +1.7V on POWER_ENABLE begins turning on the NPN transistor Q2 (power enable switch) via the resistor divider composed of resistors R13a and R14a. With +3.3V applied to POWER_ENABLE, the collector voltage of transistor Q2 approaches ground potential, pulling the bottom leg of resistor R12a down to about 0.05V. The resultant current through resistor R12a charges the bypass capacitor C6, pulling the LOW_RAIL net voltage level down to where it is clamped against the 20V LOW_RAIL_BIAS voltage by the Schottky diode D2B. This establishes 4.3V rails across the supply pins of the low-power push-pull comparator U1, the output of which turns on the PNP transistor Q1. While in the on state, the transistor Q1 connects +24V through the Schottky diode D3 to the external load.

When powered, the comparator U1 continuously monitors the emitter current of the transistor Q1 via the voltage developed across the resistor R7 to detect a high load current demand indicative of a short circuit at the sensor power connector 22. (The resistor R7 is also referred to herein as the "second resistor.") Because the voltage across the capacitor C5 cannot change instantaneously, the response of the circuit to a shorted output is immediate. (The capacitor C5 is also referred to herein as the "first capacitor.") A sudden increase in the load current demand, which is reflected in the collector current of transistor Q1, causes a proportionate sudden increase in the voltage across resistor R7 (developed by the emitter current of transistor Q1). This drives the emitter voltage of transistor Q1 lower relative to its base voltage which is AC "locked" by the capacitor C5, thereby prohibiting a further rise in collector current of transistor Q1 and allowing time for the comparator U1 to respond to the short circuit condition.

During normal operation, the voltage divider composed of resistors R4, R2 and R5 provides bias to the positive input of the comparator U1 that is some tens of millivolts lower than the R3 and R6 resistor divider provides to the negative input, thereby sending the push-pull output voltage of the comparator U1 to its negative limit. If the load current exceeds the nominal overload threshold of −39 mA, the output of the comparator U1 changes state rapidly, swinging to its positive limit, which is bolstered by the feedback from the NPO capacitor C4 (which integrates onto an NPO capacitor C3, increasing the effective time-constant). (The capacitors C3 and C4 are also referred to herein as the "third capacitor" and the "fourth capacitor", respectively.) The output drive from the comparator U1 injects charge into the capacitor C5 through the resistor R8. (The resistor R8 is also referred to herein as the "first resistor.") This starves transistor Q1 of base current, thereby causing the collector current to decay to about 36 mA before the comparator U1 again changes state after about 0.5 uS. The collector current of transistor Q1 then climbs back to 39 mA and the cycle repeats at a rate of about 1.0 MHz for as long as the load demand exceeds the overload threshold current. Output capacitor C7 reduces the output switching noise to a level of only a few millivolts during limiting. (The capacitor C7 is also referred to herein as the "second capacitor.")

Figure 11:
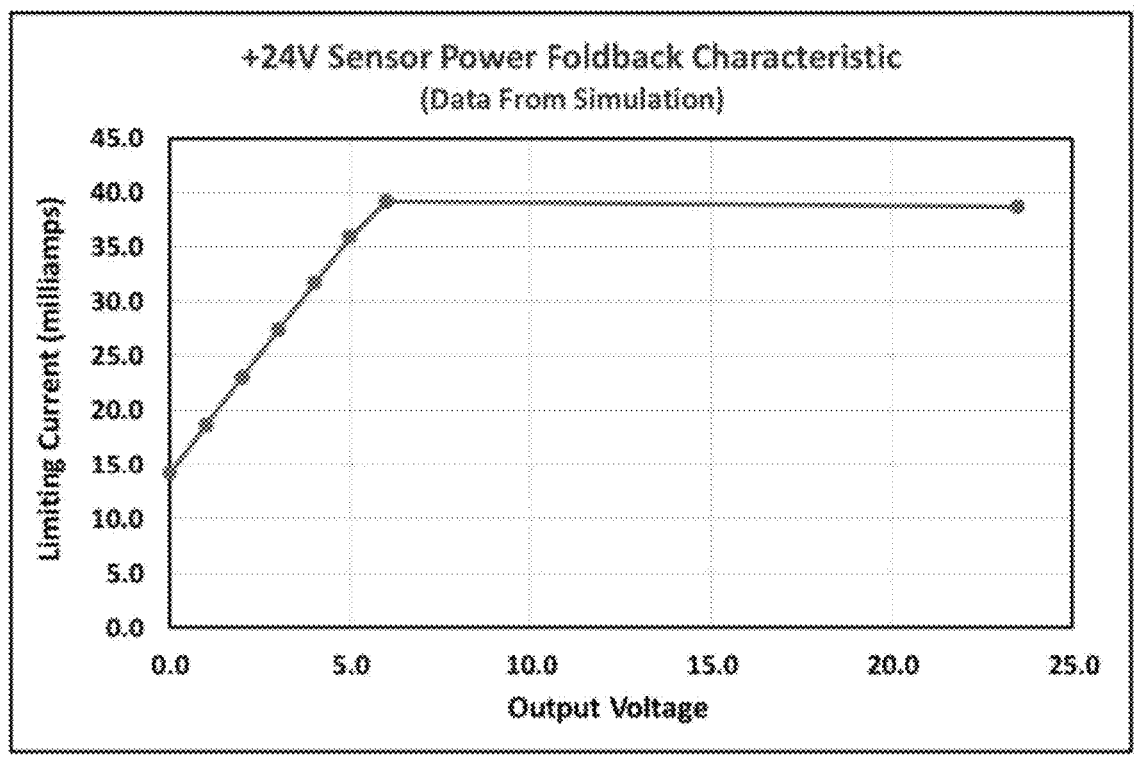
FIGS. 11 and 12 depict nominal foldback characteristics provided by a preferred embodiment of a sensor power circuit.

Nonlinear foldback limiting is provided by feedback through resistor R10 and Zener diode Z1, for the reduction of Q1 dissipation during the output short-circuit fault condition. (The resistor R10 is also referred to herein as the "third.") The NPO capacitor C2 reduces the switching threshold jitter caused by avalanche noise from the diode Z1. When the output (Q1 collector voltage) is pulled lower than about 6V, the diode Z1 begins to conduct, thereby drawing current from the inverting node of the comparator U1. This modifies the comparator input bias level, and likewise the switching threshold of the circuit, thereby resulting in a lowered current limit that prevents excess Q1 dissipation when the SENSOR_PWR output is shorted or pulled negative by an external source. The nominal foldback characteristic is depicted in FIG. 11, wherein the following values indicate the relationship between output voltage and limiting current:

| | |
|---|---|
| SENSOR_PWR = 23.5$V$ | $IOUT$ = 38.7mA |
| SENSOR_PWR = 6$V$ | $IOUT$ = 39.2mA |
| SENSOR_PWR = 5$V$ | $IOUT$ = 35.9mA |
| SENSOR_PWR = 4$V$ | $IOUT$ = 31.7mA |
| SENSOR_PWR = 3$V$ | $IOUT$ = 27.3mA |
| SENSOR_PWR = 2$V$ | $IOUT$ = 23.0mA |
| SENSOR_PWR = 1$V$ | $IOUT$ = 18.6mA |
| SENSOR_PWR = 0$V$ | $IOUT$ = 14.2mA. |

The output capacitor C7 provides loop stability during foldback limiting. The 40V Schottky diode D3 defends the circuitry against positive injected voltage of greater magnitude than the internal +24V supply. The protection diode TVS1 has a bipolar surge clamping voltage just under 50V. In conjunction with diode D3, the diode TVS1 protects against base-emitter breakdown of the transistor Q1. The −100V collector-emitter rating of transistor Q1 defends against negative voltage injection. The resistor R9 assists in the turnoff of transistor Q1 during limiting and when the POWER_ENABLE input is in the low (off) state.

Figure 13:
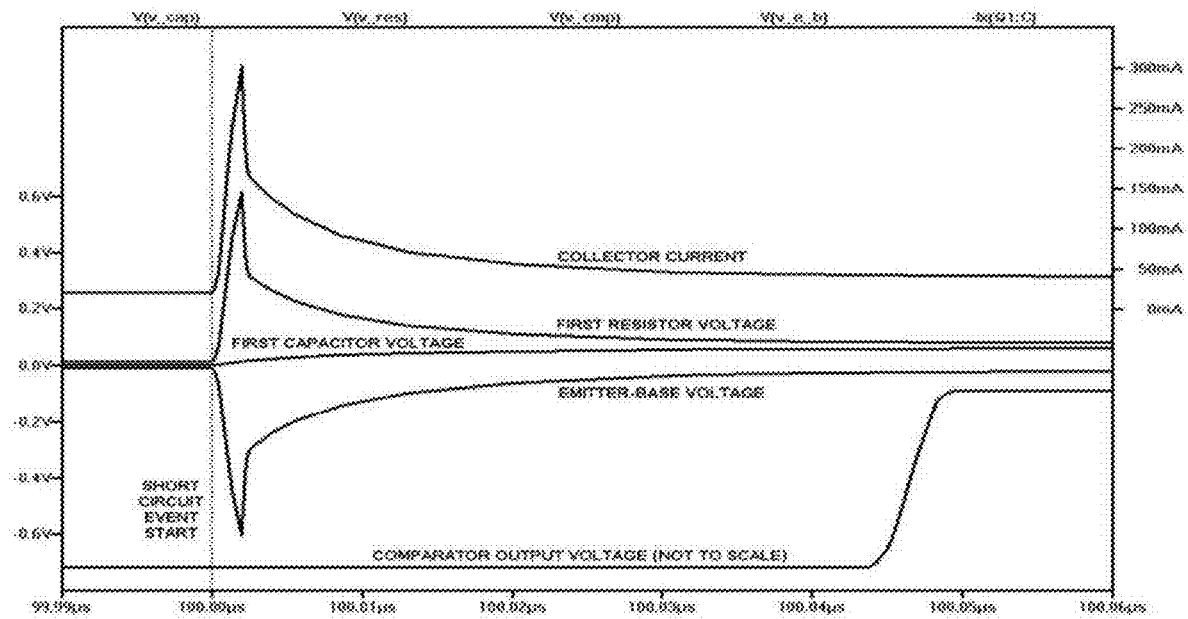
FIGS. 13 and 14 depict simulation plots showing currents and voltages associated with the power control circuit components of a preferred embodiment in response to an output short circuit event.

FIG. 13 depicts a simulation plot showing voltages associated with the power control circuit components in response to an output short circuit event. The voltage curves have been offset-normalized and scaled (the comparator output) for the purpose of display. The collector of the transistor Q1 is sourcing 20 mA of current prior to the short circuit event, which initiates at the 100 µsec mark. After the short circuit event, the collector current rises sharply, peaking at about 300 mA within 4 nanoseconds. The peak magnitude of the current is limited by the finite available base drive and the finite beta of the transistor Q1. Due to the short duration of this transient, negligible power is involved. The voltage across the resistor R7 (first resistor) increases in conjunction with the collector current, whereas the voltage across the capacitor C5 (first capacitor) increases at a much lower rate, resulting in an abrupt and significant reduction of the emitter-base voltage. With the base drive thusly removed, the collector current drops off rapidly, crossing below 50 mA approximately 25 nanoseconds into the event. At approximately 50 nanoseconds, the comparator U1 responds (bottom trace), removing base drive for the longer term.

Figure 14:
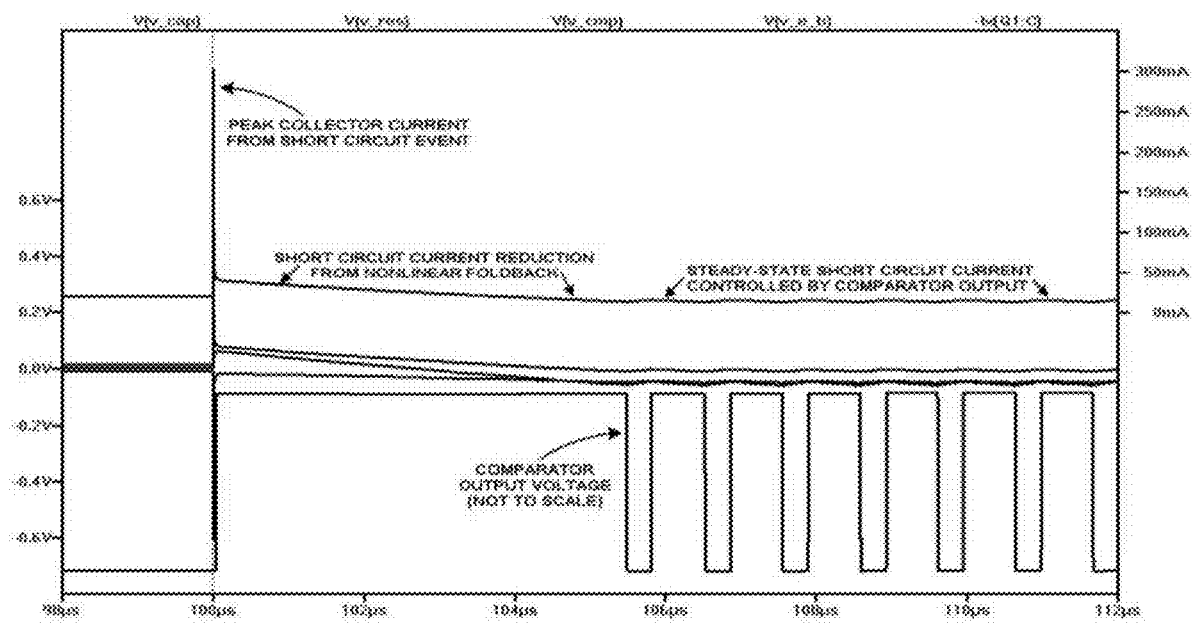

FIG. 14 depicts the same events on an expanded the time scale to show the long term steady-state short circuit response. As shown in FIG. 14, the Q1 collector current is firstly reduced (via the nonlinear foldback) and secondly controlled by the output voltage of the comparator U1, oscillating at a rate of approximately 1 MHz.

Figure 6:
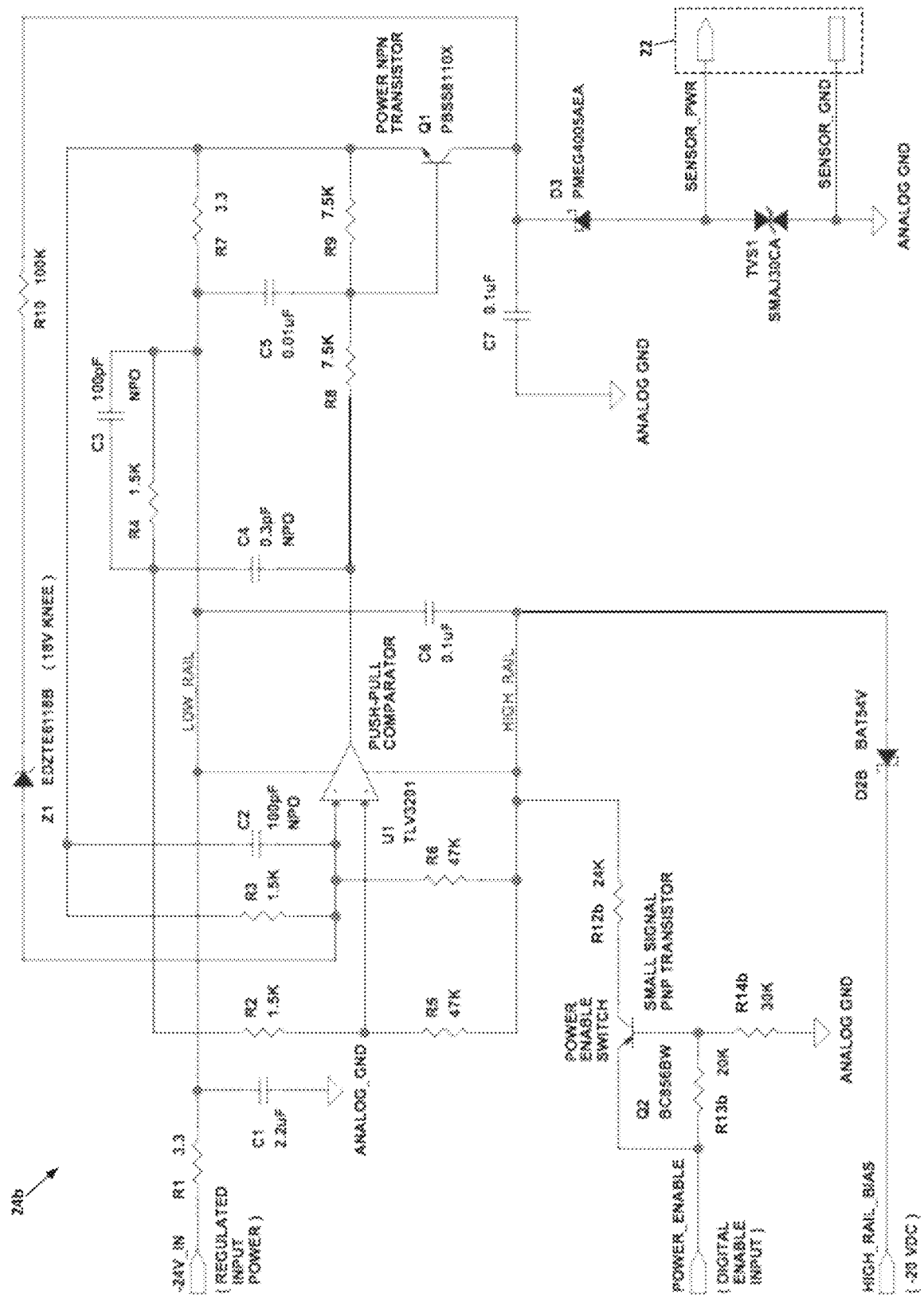

A detailed circuit diagram of a preferred embodiment of the −24V sensor power control circuit 24b for one sensor channel is provided in FIG. 6. Negative 24 VDC nominal power comes in from the left side (−24V_IN) and is low-pass filtered by the combination of resistor R1 and capacitor C1. This filter attenuates residual switching noise from the input source and provides 3.3Ω of series resistance to impede sensor-induced transient currents traveling back into the circuit. Also coming in on the left side is the POWER_ENABLE digital control signal. A nominal threshold voltage greater than +1.85V begins turning on the PNP transistor Q2 (power enable switch) via the resistor divider formed by resistors R13b and R14b. With +3.3V applied to POWER_ENABLE, the Q2 collector voltage closely follows the emitter, so that a +3.3V input control level on Q2 pulls the bottom leg of resistor R12b up to about 3.2V. The resultant R12 current charges the bypass capacitor C6, pulling the HIGH_RAIL voltage up until clamped against the −20V HIGH_RAIL_BIAS voltage by a Schottky diode D2B. This establishes 4.3V rails across the supply pins of the low-power comparator U1 the output of which turns on the NPN transistor Q1. While in the on state, transistor Q1 connects −24V through the Schottky diode D3 to the external load.

When powered, the comparator U1 continuously monitors the emitter current of transistor Q1 via the voltage developed across resistor R7. During normal operation, the voltage divider composed of resistors R4, R2 and R5 provides bias to the positive input of comparator U1 that is some tens of millivolts higher than the R3 and R6 divider provides to the negative input, thereby sending the push-pull output voltage of comparator U1 to its positive limit. If the load current exceeds the nominal overload threshold of −39 mA the output of comparator U1 changes state rapidly, swinging to its negative limit, being bolstered by the feedback from the NPO capacitor C4 (which integrates onto an NPO capacitor C3, increasing the effective time-constant). The output sink from comparator U1 pulls charge from capacitor C5 through resistor R8. This starves transistor Q1 of base current, causing the collector current to decay to about 36 mA before comparator U1 again changes state after about 0.5 uS. The collector current then climbs back to 39 mA and the cycle repeats at a rate of about 1.0 MHz as long as the load demand exceeds the overload threshold current.

Figure 12:
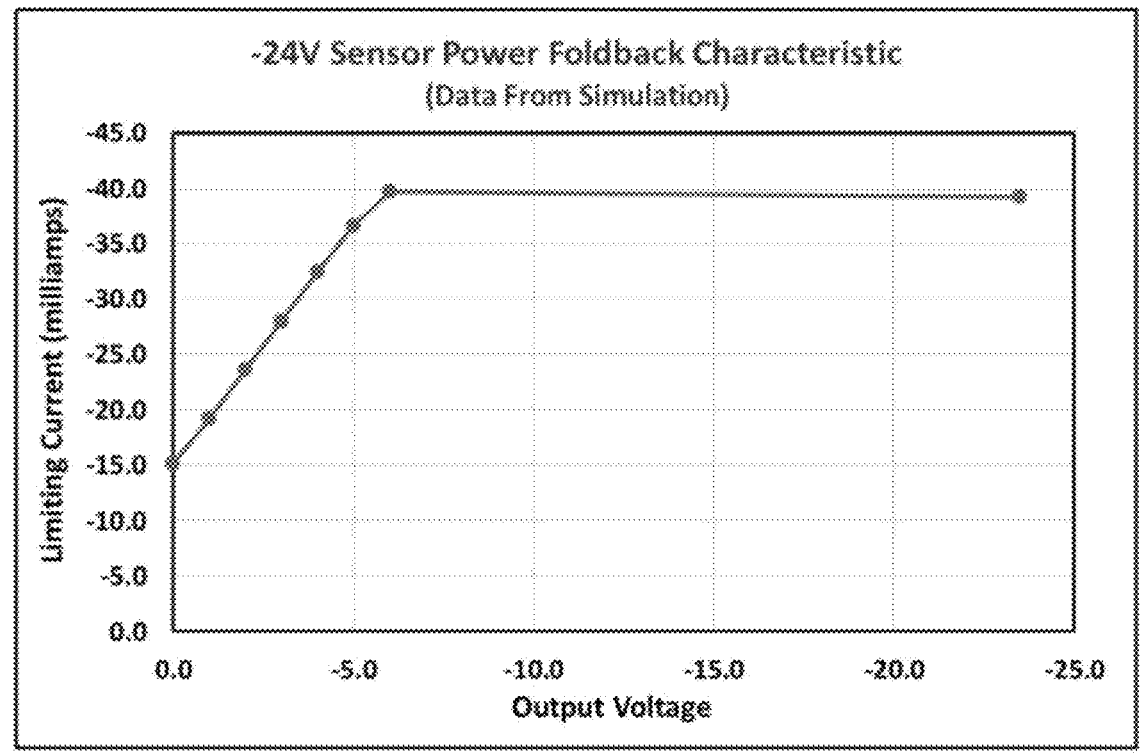

Output capacitor C7 reduces the output switching noise to the level of only a few millivolts during limiting. Because the voltage across capacitor C5 cannot change instantaneously, the response of the circuit to a shorted output is immediate. If the voltage across resistor R7 suddenly increases, the emitter of transistor Q1 is driven higher relative to the base, which is "locked" by capacitor C5. This prohibits a further rise in collector current and allows time for comparator U1 to respond. Nonlinear foldback limiting is provided by feedback through resistor R10 and Zener diode Z1, for the reduction of Q1 dissipation during the output short-circuit fault condition. The NPO capacitor C2 reduces the switching threshold jitter caused by avalanche noise from diode Z1. When the output magnitude (absolute value of transistor Q1 collector voltage) is pulled lower than about 6V, diode Z1 begins to conduct, thereby sourcing current into the inverting node of comparator U1. This modifies the comparator input bias level, and likewise the switching threshold of the circuit, resulting in a lowered current limit that prevents excess Q1 dissipation when the SENSOR_PWR output is shorted or pulled positive by an external source. The nominal foldback characteristic is depicted in FIG. 12, wherein the following values indicate the relationship between output voltage and limiting current:

$$\text{SENSOR\_PWR} = -23.5V \quad IOUT = -39.3\text{mA}$$
$$\text{SENSOR\_PWR} = -6V \quad IOUT = -39.8\text{mA}$$
$$\text{SENSOR\_PWR} = -5V \quad IOUT = -36.6\text{mA}$$
$$\text{SENSOR\_PWR} = -4V \quad IOUT = -32.4\text{mA}$$
$$\text{SENSOR\_PWR} = -3V \quad IOUT = -28.0\text{mA}$$
$$\text{SENSOR\_PWR} = -2V \quad IOUT = -23.6\text{mA}$$
$$\text{SENSOR\_PWR} = -1V \quad IOUT = -19.2\text{mA}$$
$$\text{SENSOR\_PWR} = 0V \quad IOUT = -15.1\text{mA}$$

Output capacitor C7 provides loop stability during foldback limiting. The 40V Schottky diode D3 defends the circuitry against negative injected voltage of a magnitude greater than the internal −24V supply. Protection diode TVS1 has a bipolar surge clamping voltage just under 50V. In conjunction with diode D3, the diode TVS1 protects against base-emitter breakdown of transistor Q1. The 100V collector-emitter rating of transistor Q1 defends against positive voltage injection. The resistor R9 assists in the turnoff of transistor Q1 during limiting and when the POWER_ENABLE input is in the low (off) state.

To minimize the complexity of the circuit diagrams, sensor power control circuits for only one sensor channel are depicted in FIGS. 5 and 6. In a preferred embodiment, there are eight sensor input channels that each include sensor power control circuits 24a and 24b that operate independently of the circuits 24a and 24b in the other channels.

Sensor Signal Conditioning Amplifier

In a preferred embodiment, the sensor signal conditioning circuit 25 is a precision differential input and output amplifier designed to provide an optimal match from the various supported sensor signals to the range and frequency requirements of the ADC 28. Some notable features of the amplifier 25 include the following:

Precision gain provided by use of 0.1%, 25 ppm/° C. resistors;
Low DC offset (for accurate DC sensor measurements);
Low offset drift with temperature (for consistent DC sensor measurements);
Low noise levels, both wideband and 1/f noise;
Nearly flat gain from DC to 40 KHz by use of gain equalization network;
Incorporates requisite ADC Nyquist filtering;
Differential input rejects common mode signals;
High impedance inputs minimize sensor signal loading;
Pre-filters protect op-amp inputs from RF interference;
Nearly constant group delay from DC to 40 KHz;
Better than 1% gain accuracy with no calibration from DC to 40 KHz;
Single-rail 5 volt power avoids the need for negative supply; and
Low material cost.

Figure 7:
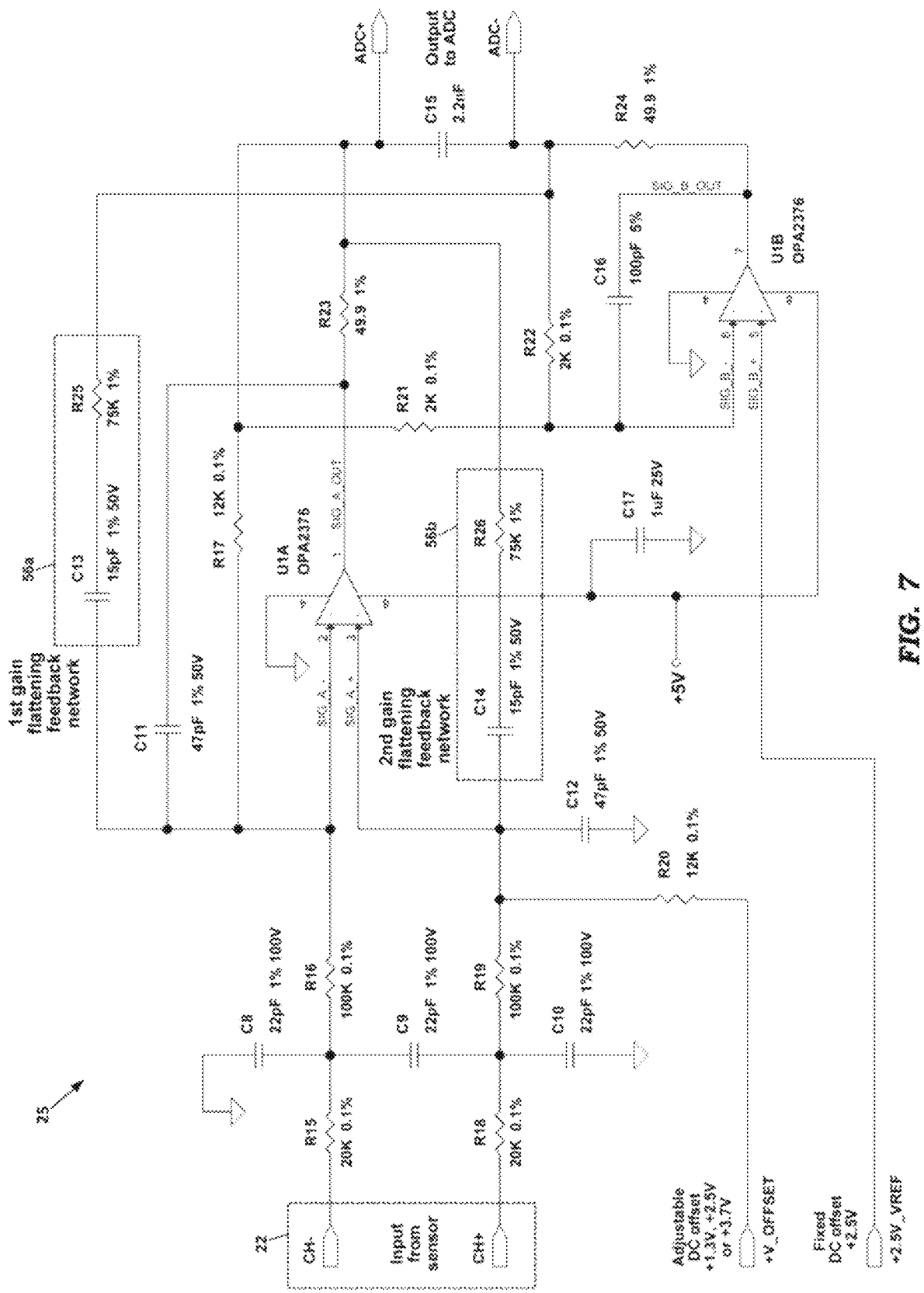
FIG. 7 depicts a sensor signal conditioning amplifier according to an embodiment of the invention.

As depicted in the schematic diagram of FIG. 7, the preferred embodiment of the signal conditioning amplifier 25 is a minimalist differential op-amp design that directly interfaces to the sensor signal input terminals 22 to provide signal scaling and offset, and additionally directly drives the differential inputs of the ADC 28. It also incorporates the function of Nyquist filtering ahead of the ADC 28, thereby providing a nominal 110 dB rejection of out-of-band signals. Gain flattening is provided by balanced positive feedback networks 56a and 56b, providing a nearly flat gain response from DC to 40 KHz.

With reference to FIG. 7, the gain is established by the ratio of precision resistor R17 to precision resistors R15 plus R16. The differential balance is provided by the ratio of precision resistor R20 to precision resistors R18 and R19. The Nyquist filtering is partially realized by the RC network composed of resistors R15, R16, R18, R19, and capacitors C8, C9 and C10. Further filtering is achieved by the interaction of resistor R17 and capacitor C11, with balance provided by resistor R20 and capacitor C12. Finally, resistors R23 and R24 and capacitor C15 contribute filtering in the low MHz range in conjunction with op-amp bandwidth limitation. The balanced RC networks composed of C13/R25 and C14/R26 provide modest gain peaking to flatten the gain curve within the 0 to 40 KHz band of interest. Resistors R23 and R24 isolate the op-amp outputs from the capacitive load of capacitor C15 to insure op-amp stability. Capacitor C15 satisfies the interface requirement of the differential ADC input.

Figure 16:
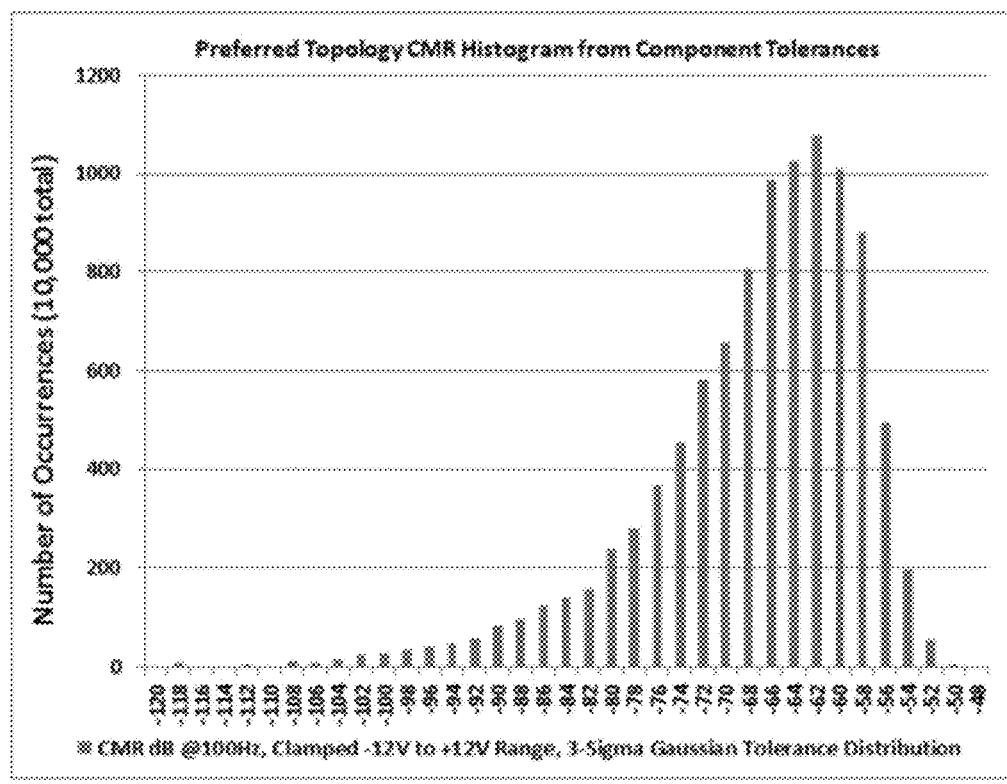
FIG. 16 depicts the results of a Monte Carlo simulation of the common mode rejection (CMR) of a preferred embodiment of a signal conditioning amplifier at 100 Hz, using a Gaussian distribution of component tolerances.

In the preferred embodiment, the DC feedback signal for the op-amp U1B (facilitated by R22) and the feedback signals driving both gain flattening networks 56a-56b are derived from the ADC+ and ADC− nets, i.e., from the output side of the stability-enhancing resistors R23 and R24. The DC negative feedback for the 1st op-amp (facilitated by R17) is derived from the ADC+ net. The AC feedback signals facilitated by C11 and C16 are derived directly from the op-amp outputs. Assuming ideal components (including the op-amps), this preferred embodiment introduces no DC error into measurements, i.e., it is ideally balanced for DC signals. FIG. 16 depicts Common Mode Rejection (CMR) histogram results of Monte Carlo simulations for the preferred circuit topology as depicted in FIG. 7. Although this data was derived for a 100 Hz signal, the DC performance would be virtually identical.

Figure 8:
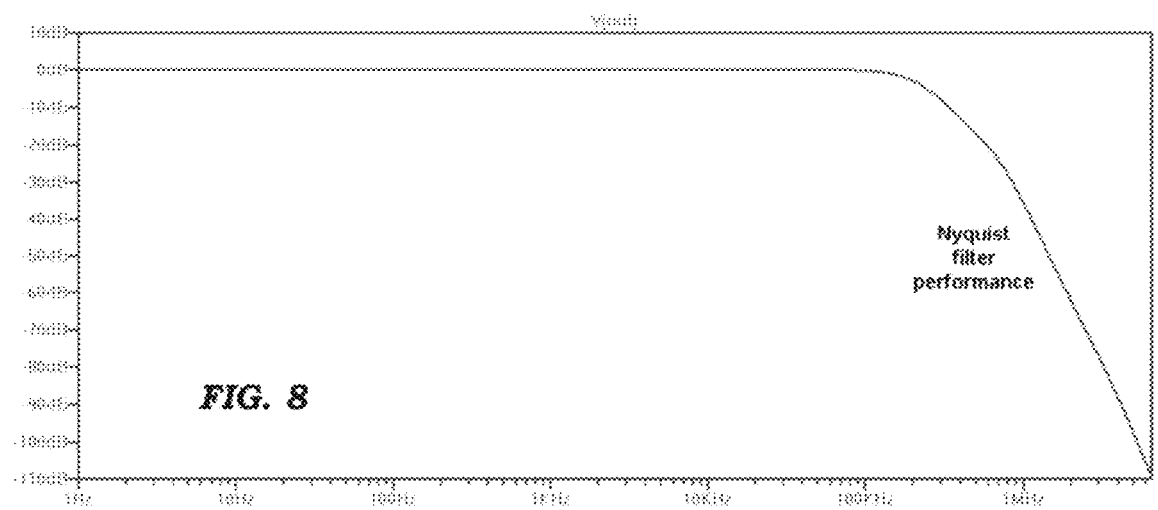
FIGS. 8, 9 and 10 depict normalized amplifier gain versus frequency curves for a preferred embodiment of the sensor signal conditioning amplifier.

The simulation curve of FIG. 8 shows the nominal normalized gain vs frequency of a preferred embodiment of the amplifier 25 up to the ADC over-sampling Nyquist frequency of 6.5536 MHz.

Figure 9:
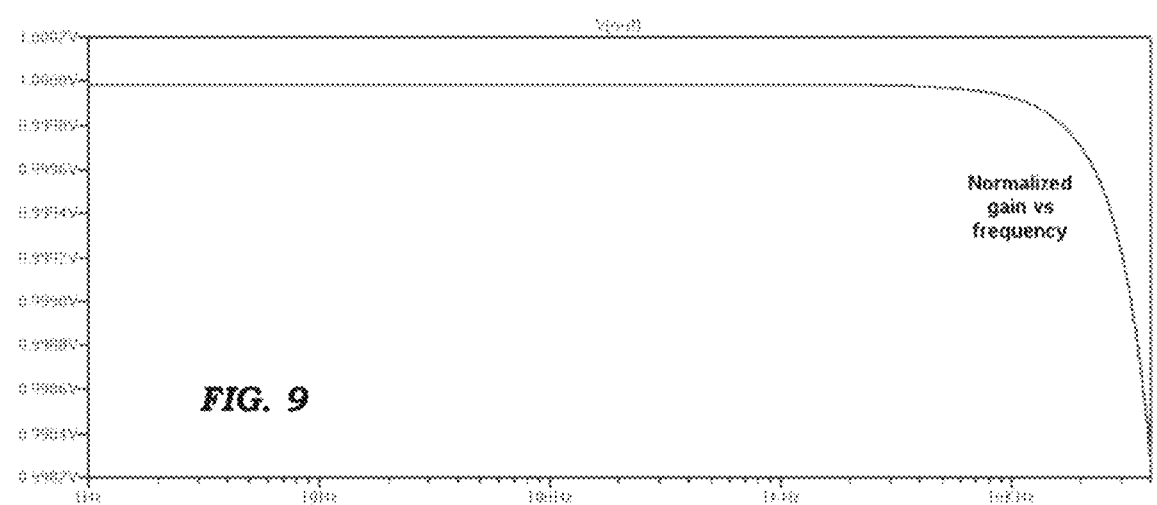
Figure 15:
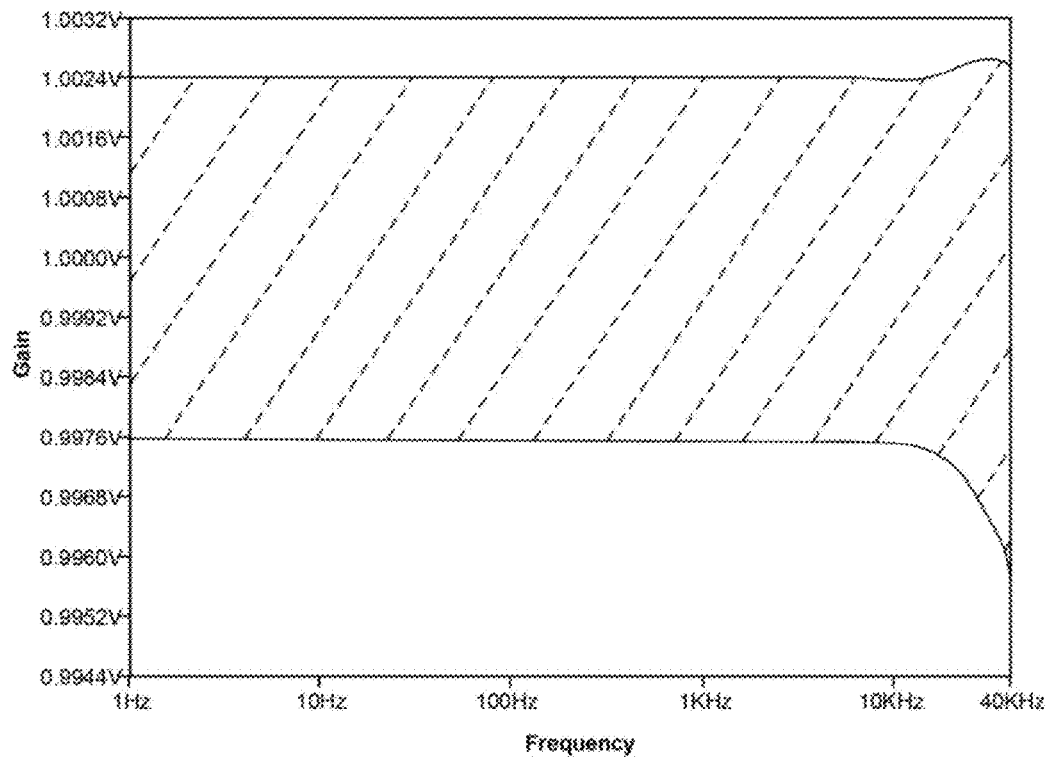
FIG. 15 depicts the results of a Monte Carlo simulation of the pass-band gain of a preferred embodiment of a signal conditioning amplifier from DC to 4 KHz, using a purely random distribution of component tolerances.

The normalized curve of FIG. 9 shows the flatness of the DC to 40 KHz pass-band gain of a preferred embodiment of the amplifier 25, from the sensor signal inputs 22 to the input of the ADC 28. FIG. 15 depicts a 10,000-run Monte Carlo simulation of the pass-band gain of a preferred embodiment of the amplifier 25 from DC to 40 KHz, using a purely random distribution of component tolerances. As FIG. 15 indicates, the pass-band gain varies by no more than about 0.8%, as calculated based on ((1002.7 mV-995.6 mV) 999.15 mV)×100%.

Figure 10:
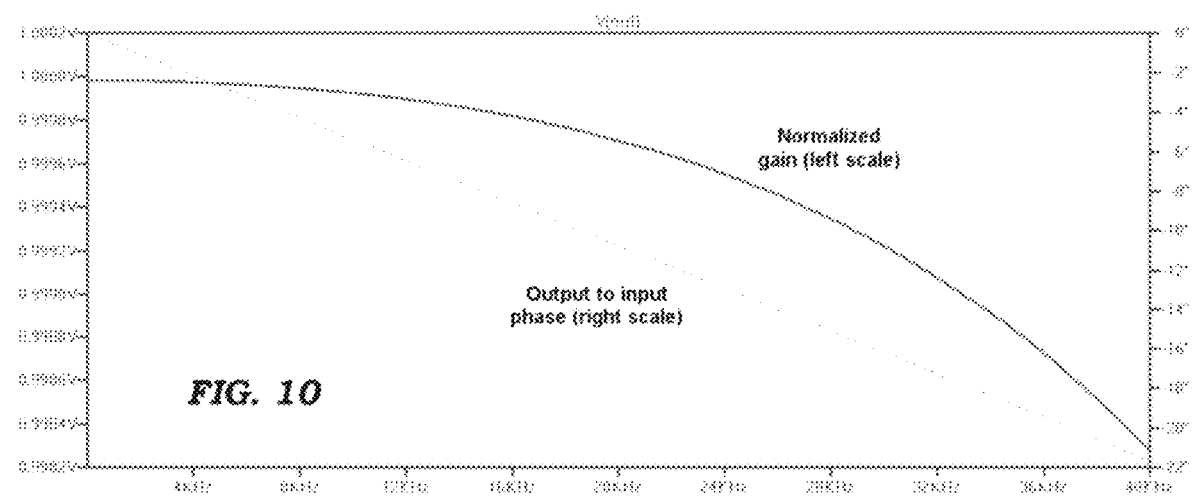

FIG. 10 shows the normalized gain and output phase shift of a preferred embodiment of the amplifier 25 on a linear frequency scale. The phase (dotted curve) has a near-linear relationship to frequency. Input-to-output group delay is approximately 1.5 microseconds in the preferred embodiment.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A sensor signal conditioning circuit of a machinery health monitoring module, the sensor signal conditioning circuit disposed between a machine sensor and an analog-to-digital converter (ADC) having positive and negative inputs, the sensor signal conditioning circuit comprising:

a sensor interface connector that is operable to connect to multiple types of sensors that may be attached to a machine to monitor various characteristics of the machine, the sensor interface connector for receiving a differential or single-ended analog sensor signal generated by a connected sensor, the sensor interface connector comprising a negative sensor signal input and a positive sensor signal input;

a first operational amplifier for providing a high impedance differential interface to the analog sensor signal and a low impedance interface to the positive input of the ADC, the first operational amplifier having a negative signal input, a positive signal input, and a signal output;

a second operational amplifier for providing an inverted copy of a signal at the positive input of the ADC and a low impedance interface to the negative input of the ADC, the second operational amplifier having a negative signal input, a positive signal input, and a signal output;
a passive Nyquist filter connected between the negative sensor signal input of the sensor interface connector and the negative signal input of the first operational amplifier, and between the positive sensor signal input of the sensor interface connector and the positive signal input of the first operational amplifier;
a first gain flattening feedback network connected between the negative signal input of the first operational amplifier and the negative input of the ADC; and
a second gain flattening feedback network connected between the positive signal input of the first operational amplifier and the positive input of the ADC,
wherein the signal output of the first operational amplifier is electrically coupled to the positive input of the ADC, and
wherein the signal output of the second operational amplifier is electrically coupled to the negative input of the ADC.

2. The sensor signal conditioning circuit of claim 1, wherein the passive Nyquist filter includes:
a resistor R15 having:
a first side that is electrically coupled to the negative sensor signal input of the sensor interface connector; and
a second side;
a resistor R16 having:
a first side that is electrically coupled to the second side of the resistor R15; and
a second side that is electrically coupled to the negative signal input of the first operational amplifier;
a resistor R18 having:
a first side that is electrically coupled to the positive sensor signal input of the sensor interface connector; and
a second side;
a resistor R19 having:
a first side that is electrically coupled to the second side of the resistor R18; and
a second side that is electrically coupled to the positive signal input of the first operational amplifier;
a capacitor C8 having:
a first side that is electrically coupled to the second side of the resistor R15; and
a second side that is electrically coupled to electrical ground;
a capacitor C9 having:
a first side that is electrically coupled to the second side of the resistor R15; and
a second side that is electrically coupled to the second side of the resistor R18; and
a capacitor C10 having:
a first side that is electrically coupled to the second side of the resistor R18; and
a second side that is electrically coupled to electrical ground,
wherein the resistors R15, R16, R18 and R19 comprise thin film resistors having a resistance value tolerance of no more than 0.1%, and
wherein capacitance values of the capacitors C8, C9 and C10 have a tolerance of no more than 1%.

3. The sensor signal conditioning circuit of claim 2 further comprising a resistor R17 having:
a first side that is electrically coupled to the negative signal input of the first operational amplifier; and
a second side that is electrically coupled to the positive ADC input connection,
wherein the gain of the sensor signal conditioning circuit is determined by twice the ratio of the resistance value of the resistor R17 to a sum of the resistance values of the resistors R15 and R16, and
wherein the resistor R17 comprises a thin film resistor having a resistance value tolerance of no more than 0.1%.

4. The sensor signal conditioning circuit of claim 2 further comprising:
an adjustable DC offset input; and
a resistor R20 having:
a first side that is electrically coupled to the positive signal input of the first operational amplifier; and
a second side that is electrically coupled to the adjustable DC offset input,
wherein the input differential voltage offset of the sensor signal conditioning circuit is determined by the product of a multiplicand, which is the ratio of the sum of the resistance values of the resistors R18 and R19 to the resistance value of the resistor R20, and a multiplier, which is the difference between a fixed DC offset voltage and a voltage at the adjustable DC offset voltage input, and
wherein the resistor R20 comprises a thin film resistor having a resistance value tolerance of no more than 0.1%.

5. The sensor signal conditioning circuit of claim 1, wherein the first gain flattening feedback network comprises:
a capacitor C13 having:
a first side that is electrically coupled to the negative signal input of the first operational amplifier; and
a second side; and
a resistor R25 having:
a first side that is electrically coupled to the second side of the capacitor C13; and
a second side that is electrically coupled to the signal output of the second operational amplifier; and
the second gain flattening feedback network comprises:
a capacitor C14 having:
a first side that is electrically coupled to the positive signal input of the first operational amplifier; and
a second side; and
a resistor R26 having:
a first side that is electrically coupled to the second side of the capacitor C14; and
a second side that is electrically coupled to the signal output of the first operational amplifier,
wherein the resistors R25 and R26 have a tolerance of no more than 1%, and
wherein capacitance values of the capacitors C13 and C14 have a tolerance of no more than 1%.

6. The sensor signal conditioning circuit of claim 1 wherein the sensor interface connector is operable to connect to multiple types of sensors selected from the group consisting of piezo accelerometers, Integrated Circuit Piezoelectric (ICP) vibration sensors, piezo dynamic pressure sensors, electro-dynamic velocity sensors, eddy current displacement sensors, AC vibration sensors, DC displacement sensors, passive electro-magnetic sensors, Hall Effect tachometer sensors, shaft encoder sensors, and transistor-transistor logic (TTL) pulse sensors.

7. The sensor signal conditioning circuit of claim 1 wherein the first operational amplifier is powered by a single rail +5 VDC power connection, and no negative power connection.

8. The sensor signal conditioning circuit of claim 1 wherein variation in signal gain from the sensor interface connector through to the output connection to the ADC over a frequency range of zero to 40 KHz is no more than about 0.8% with no calibration.

\* \* \* \* \*